(12) United States Patent
Hirano et al.

(10) Patent No.: US 8,394,578 B2
(45) Date of Patent: Mar. 12, 2013

(54) METHOD OF FORMING RESIST PATTERN AND NEGATIVE TONE-DEVELOPMENT RESIST COMPOSITION

(75) Inventors: Tomoyuki Hirano, Kawasaki (JP); Takahiro Dazai, Kawasaki (JP); Daiju Shiono, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 66 days.

(21) Appl. No.: 13/028,594

(22) Filed: Feb. 16, 2011

(65) Prior Publication Data
US 2011/0244399 A1  Oct. 6, 2011

(30) Foreign Application Priority Data

Feb. 18, 2010 (JP) .................. 2010-033426
Jun. 28, 2010 (JP) .................. 2010-146284

(51) Int. Cl.
*G03F 7/26* (2006.01)

(52) U.S. Cl. .................. 430/322; 430/270.1

(58) Field of Classification Search .......... 430/222, 430/331, 325, 270.1
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 7,074,543 B2 | 7/2006 | Iwai et al. | |
| 7,459,261 B2 | 12/2008 | Hatakeyama et al. | |
| 7,482,108 B2 | 1/2009 | Matsumaru et al. | |
| 2008/0187860 A1 | 8/2008 | Tsubaki et al. | |
| 2009/0042147 A1* | 2/2009 | Tsubaki | 430/326 |
| 2011/0117497 A1 | 5/2011 | Sato et al. | |

FOREIGN PATENT DOCUMENTS

| | | |
|---|---|---|
| JP | A-06-194847 | 7/1994 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-090991 | 3/2002 |
| JP | A-2003-241385 | 8/2003 |
| JP | A-2008-292975 | 4/2008 |
| JP | A-2008-292975 | 12/2008 |
| WO | WO 2004/074242 | 9/2004 |
| WO | WO 2010/001913 A1 | 1/2010 |

OTHER PUBLICATIONS

Gil et al., "First Microprocessors with Immersion Lithography," *Optical Microlithography XVIII, Proceedings of SPIE* vol. 5754, pp. 119-128 (2005).
Borodovsky, Yan, "Marching to the Beat of Moore's Law," *Proceedings of SPIE*, vol. 6153, pp. 615301-1 to 615301-19, (2006).
Ebihara et al., "Beyond $k_1$=0.25 lithography: 70nm L/S patterning using KrF scanners," *Proceedings of SPIE*, vol. 5256, 23rd Annual BACUS Symposium on Photomask Technology, pp. 985-994, (2003).

* cited by examiner

*Primary Examiner* — Kathleen Duda
*Assistant Examiner* — Caleen Sullivan
(74) *Attorney, Agent, or Firm* — Knobbe Martens Olson & Bear LLP

(57) ABSTRACT

A method of forming a resist pattern, including: forming a resist film on a substrate using a resist composition containing a base component (A) which exhibits decreased solubility in an organic solvent under action of an acid and an acid-generator component (B) which generates an acid upon exposure, conducting exposure of the resist film, and patterning the resist film by a negative tone development using a developing solution containing an organic solvent, wherein the base component (A) includes a resin component (A1) containing a structural unit (a1) derived from an acrylate ester containing an acid decomposable group which exhibits increased hydrophilicity by the action of an acid and a structural unit (a0) derived from an acrylate ester containing an —$SO_2$— containing cyclic group.

3 Claims, 1 Drawing Sheet

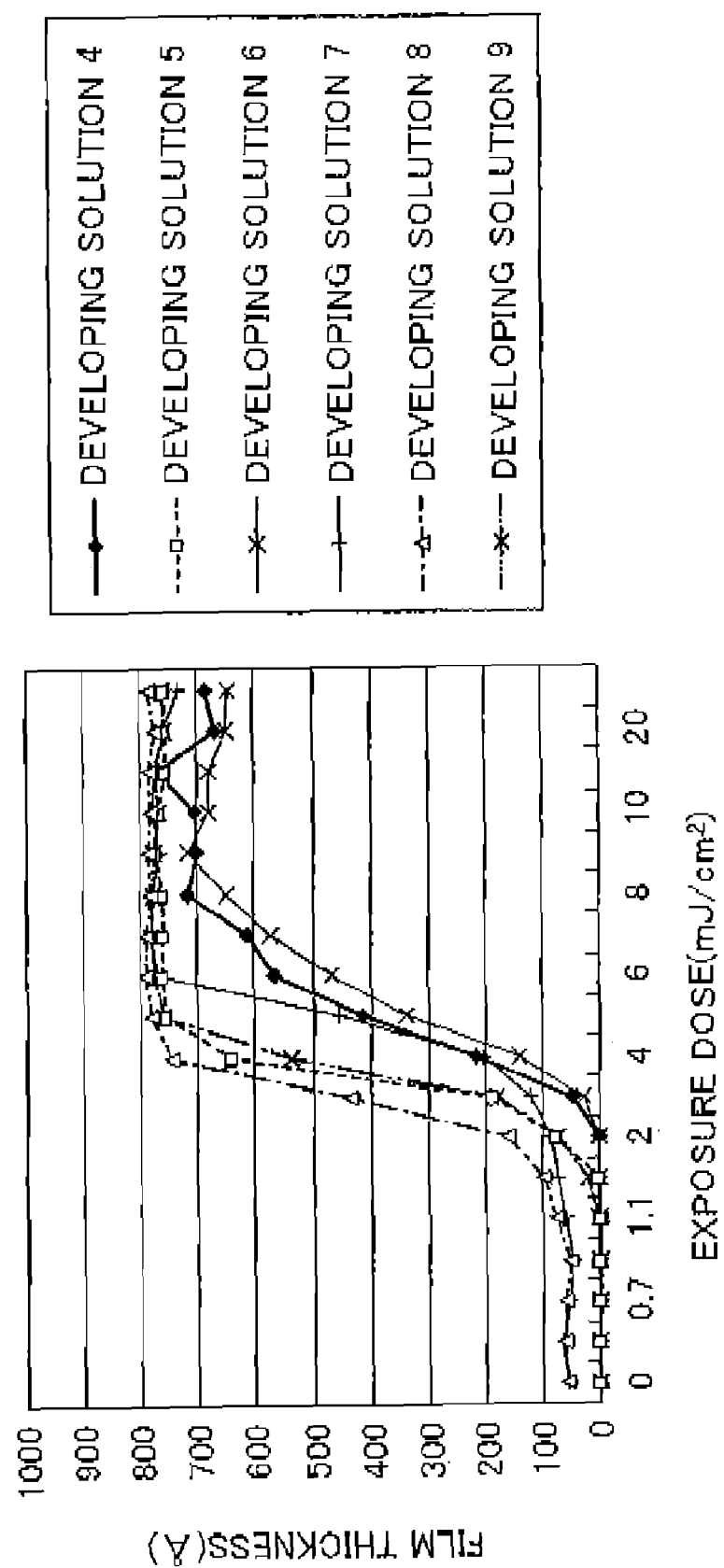

METHOD OF FORMING RESIST PATTERN AND NEGATIVE TONE-DEVELOPMENT RESIST COMPOSITION

TECHNICAL FIELD

The present invention relates to a method of forming a resist pattern by a negative tone development using a developing solution containing an organic solvent, and a negative tone-development resist composition which is used in the method.

Priority is claimed on Japanese Patent Application No. 2010-033426, filed Feb. 18, 2010, and Japanese Patent Application No. 2010-146284, filed Jun. 28, 2010, the contents of which are incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Document 1).

In recent years, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, various lithography properties of the resist material are required, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in an alkali developing solution under the action of acid and an acid-generator component that generates acid upon exposure is generally used. For example, in a chemically amplified positive resist composition, a base component which exhibits increased solubility in an alkali developing solution under action of acid is used.

Conventionally, a resin (base resin) is typically used as the base component of a chemically amplified resist composition. Resins that contain structural units derived from (meth)acrylate esters within the main chain (acrylic resins) are the mainstram as base resins for chemically amplified resist compositions that use ArF excimer laser lithography, as they exhibit excellent transparency in the vicinity of 193 nm. Here, the term "(meth)acrylic acid" is a generic term that includes either or both of acrylic acid having a hydrogen atom bonded to the $\alpha$-position and methacrylic acid having a methyl group bonded to the $\alpha$-position. The term "(meth)acrylate ester" is a generic term that includes either or both of the acrylate ester having a hydrogen atom bonded to the $\alpha$-position and the methacrylate ester having a methyl group bonded to the $\alpha$-position. The term "(meth)acrylate" is a generic term that includes either or both of the acrylate having a hydrogen atom bonded to the $\alpha$-position and the methacrylate having a methyl group bonded to the $\alpha$-position.

In general, the base resin contains a plurality of structural units for improving lithography properties and the like. For example, in the case of a positive type, a structural unit having a lactone structure and a structural unit having a polar group such as a hydroxy group are generally used, as well as a structural unit having an acid decomposable group which is decomposed by the action of an acid generated from the acid generator to form an alkali soluble group (for example, see Patent Document 2). Among these structural units, a structural unit having a lactone structure is generally considered as being effective in improving the adhesion between the resist film and the substrate, and increasing the compatibility with an alkali developing solution, thereby contributing to improvement in various lithography properties.

In addition, a resin component useful for a resist has been proposed recently which contains a structural unit having a cyclic group including a sulfonyl group ($-SO_2-$) (hereafter, frequently referred to as $-SO_2-$ containing cyclic group) (for example, see Patent Document 3). By virtue of including an $-SO_2-$ containing cyclic group, this resin component exhibits a high solubility in an alkali developing solution, as compared to a resin component in which the $-SO_2-$ containing group has been replaced by, for example, a lactone structure. Therefore, by using the resin component as the base resin, improvement in lithography properties such as resolution is expected.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern. Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive tone development process is tended to be used in the formation of an extremely fine resist pattern.

However, in the case of forming a trench pattern (isolated space pattern) or a hole pattern by the positive tone development process, it becomes necessary to form a resist pattern using an incident light weaker than that used in the case of a line pattern or a dot pattern, such that the contrast of the intensity of the incident light between exposed portions and unexposed portions becomes unsatisfactory. Therefore, pattern formation performance such as resolution tends to be restricted, and it becomes difficult to form a resist pattern with a high resolution.

In contrast, a negative tone development process using a negative type, chemically amplified resist composition (i.e., a chemically amplified resist composition which exhibits decreased alkali solubility in an alkali developing solution upon exposure) in combination with an alkali developing solution is advantageous over the positive tone development process in the formation of a trench pattern or a hole pattern.

As a negative tone development process, a process has been proposed in which a positive type, chemically amplified resist composition is used in combination with a developing solution containing an organic solvent (hereafter, frequently referred to as "organic developing solution") (for example, see Patent Document 4). A positive type, chemically amplified resist composition exhibits increased solubility in an alkali developing solution upon exposure, but comparatively, the solubility in an organic solvent is decreased. Therefore, in a negative tone development process, the unexposed portions of the resist film are dissolved and removed by an organic solvent-type developing solution to thereby form a resist pattern.

DOCUMENTS OF RELATED ART

Patent Document

[Patent Document 1] Japanese Unexamined Patent Application, First Publication No. Hei 6-194847
[Patent Document 2] Japanese Unexamined Patent Application, First Publication No. 2003-241385
[Patent Document 3] WO 2010/001913
[Patent Document 2] Japanese Unexamined Patent Application, First Publication No. 2008-292975

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 615301-1-19 (2006)

SUMMARY OF THE INVENTION

The negative tone development process using a positive type, chemically amplified resist composition in combination with an organic developing solution, as in the case of using a negative type, chemically amplified resist composition in combination with an alkali developing solution, is considered to be advantageous in the formation of a trench pattern or a hole pattern.

However, as further progress is made in lithography techniques and the application field for lithography techniques expands, improvement is required in the negative tone development process and the chemically amplified resist composition used in the process. For example, as a matter of course, improvement in the resolution and improvement in the sensitivity together with shortening of the wavelength (increasing the energy) of the exposure light source are required, but also, reducing the roughness which develop on the upper surface and side wall surfaces of the formed pattern is required. The roughness becomes the cause of defects in the shape of the resist pattern, and therefore, improvement thereof is important as the pattern size becomes smaller. For example, roughness on the side wall surfaces of a pattern can cause various defects such as non-uniformity of the line width of line and space patterns, or distortions around the holes in hole patterns. Such defects adversely affect the formation of very fine semiconductor elements.

The present invention takes the above circumstances into consideration, with an object of providing a method of forming a resist pattern by a negative tone process using a developing solution containing an organic solvent which enables formation of fine resist patterns with excellent lithography properties, and a negative tone-development resist composition used in the same method.

It is considered that a resist composition containing a resin component which exhibits a low solubility in an organic solvent as the base component is unsuitable for a negative tone development process using a organic solvent-type developing solution. However, as a result of intensive studies of the present inventors, they have found that, by using a resist composition containing a resin component having a specific structural unit having an —$SO_2$— group containing cyclic group as the base component, despite that the resin component exhibits a high solubility in an alkali developing solution and a low solubility in an organic solvent, a negative tone development process using an organic solvent-type developing solution could be satisfactorily performed, and various lithography properties could be improved. The present invention has been completed based on this finding.

Specifically, a first aspect of the present invention is a method of forming a resist pattern, including: forming a resist film on a substrate using a resist composition containing a base component (A) which exhibits decreased solubility in an organic solvent under action of an acid and an acid-generator component (B) which generates an acid upon exposure, conducting exposure of the resist film, and patterning the resist film by a negative tone development using a developing solution containing an organic solvent, wherein the base component (A) includes a resin component (A1) containing a structural unit (a1) derived from an acrylate ester containing an acid decomposable group which exhibits increased hydrophilicity by the action of an acid and a structural unit (a0) derived from an acrylate ester containing an —$SO_2$— containing cyclic group.

A second aspect of the present invention is a negative tone-development resist composition used for a method of forming a resist pattern, the method including: forming a resist film on a substrate using a resist composition containing a base component (A) which exhibits decreased solubility in an organic solvent under action of an acid and an acid-generator component (B) which generates an acid upon exposure, conducting exposure of the resist film, and patterning the resist film by a negative tone development using a developing solution containing an organic solvent, wherein the base component (A) includes a resin component (A1) containing a structural unit (a1) derived from an acrylate ester containing an acid decomposable group which exhibits increased hydrophilicity by the action of an acid and a structural unit (a0) derived from an acrylate ester containing an —$SO_2$— containing cyclic group.

According to the present invention, there are provided a method of forming a resist pattern by a negative tone process using a developing solution containing an organic solvent which enables formation of fine resist patterns with excellent lithography properties, and a negative tone-development resist composition used in the same method.

BRIEF DESCRIPTION OF THE DRAWINGS

FIG. 1 is a graph showing the contrast curve obtained from the evaluation results of Test Example 2.

DETAILED DESCRIPTION OF THE INVENTION

<<Method of Forming a Resist Pattern>>

The method of forming a resist pattern according to the present invention includes forming a resist film on a substrate using a resist composition (hereafter, frequently referred to as "negative tone-development resist composition") containing a base component (A) which exhibits decreased solubility in an organic solvent under action of an acid and an acid-generator component (B) which generates an acid upon exposure, conducting exposure of the resist film, and patterning the resist film by a negative tone development using a developing solution containing an organic solvent.

In a negative tone-development resist composition, when radial rays are irradiated (when exposure is conducted), acid is generated from the acid-generator component (B), and the solubility of the base component (A) in an organic solvent is decreased by the action of the acid. Therefore, in the formation of a resist pattern, by conducting selective exposure of a resist film formed by using the negative tone-development resist composition, the solubility of the exposed portions in a developing solution containing an organic solvent (hereafter, frequently referred to as "organic developing solution") is decreased, whereas the solubility of the unexposed portions in an organic developing solution is unchanged, and hence, a resist pattern can be formed by removing the unexposed portions by negative tone development using an organic developing solution.

In the method of forming a resist pattern according to the present invention, the base component (A) of the negative tone-development resist composition includes a resin component (A1) containing a structural unit (a1) derived from an acrylate ester containing an acid decomposable group which exhibits increased hydrophilicity by the action of an acid and a structural unit (a0) derived from an acrylate ester containing an —$SO_2$— containing cyclic group. As the negative tone-development resist composition, the negative tone-development resist composition according to the present invention described later can be used.

More specifically, the method for forming a resist pattern according to the present invention can be performed, for example, as follows.

Firstly, a negative tone-development resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The developing treatment is performed using an organic developing solution.

As the organic solvent to be used as the developing solution, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate and γ-butyrolactone.

Examples of ester solvents include chain-like ester solvents, such as methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate. Examples of cyclic ester solvents include lactones such as γ-butyrolactone.

As the ester solvent, a solvent represented by general formula (1) described later or a solvent represented by general formula (2) described later is preferable, a solvent represented by general formula (1) is more preferable, an alkyl acetate is still more preferable, and butyl acetate is particularly desirable.

Examples of alcohol solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol solvents, such as ethylene glycol, diethylene glycol and triethylene glycol; and glycol ether solvents containing a hydroxy group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these examples, a glycol ether solvent is preferable.

Examples of ether solvents include the aforementioned glycol ether solvents containing a hydroxy group; glycol ether solvents containing no hydroxy group, such as propylene glycol dimethyl ether, propylene glycol diethyl ether, diethylene glycol dimethyl ether and diethylene glycol diethyl ether: dioxane; tetrahydrofuran; anisole; perfluoro-2-butyltetrahydrofuran, perfluorotetrahydrofuran and 1,4-dioxane. Among these, a glycol ether solvent containing a hydroxy group or a glycol ether solvent containing no hydroxy group is preferable.

Examples of amide solvents include N-methyl-2-pyrrolidone, N,N-dimethylacetamide, N,N-dimethylformamide, hexamethylphosphoric amide and 1,3-dimethyl-2-imidazolidinone.

Examples of hydrocarbon solvents include aliphatic hydrocarbon solvents, such as pentane, hexane, octane, decane, 2,2,4-trimethylpentane, 2,2,3-trimethylhexane, perfluorohexane and perfluoronpetane; and aromatic hydrocarbon solvents, such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these examples, an aromatic hydrocarbon solvent is preferable.

These solvents can be used individually, or at least 2 solvents may be mixed together. Further, an organic solvent other than the aforementioned examples or water may be mixed together.

As the organic solvent for the organic developing solution, a solvent represented by general formula (1) or (2) shown below is preferable.

$$R^{00}-C(=O)-O-R^{01} \tag{1}$$

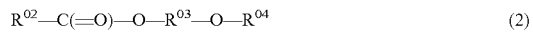

$$R^{02}-C(=O)-O-R^{03}-O-R^{04} \tag{2}$$

In formula (1), each of $R^{00}$ and $R^{01}$ independently represents a hydrogen atom, an alkyl group, an alkoxy group, an alkoxycarbonyl group, a carboxy group, a hydroxy group, a cyano group or a halogen atom, provided that $R^{00}$ and $R^{01}$ may be mutually bonded to form a ring. In formula (2), each of $R^{02}$ and $R^{04}$ independently represents a hydrogen atom, an alkyl group, an alkoxy group, an alkoxycarbonyl group, a carboxy group, a hydroxy group, a cyano group or a halogen atom, provided that $R^{02}$ and $R^{04}$ may be mutually bonded to form a ring; and $R^{03}$ represents an alkylene group.

In formula (1), the alkyl group for $R^{00}$ and $R^{01}$ may be linear, branched or cyclic, preferably linear or branched, and preferably has 1 to 5 carbon atoms. The alkyl group may have a substituent. Examples of the substituent include a hydroxy group, a carboxy group and a cyano group.

As the alkyl group within the alkoxy group and the alkoxycarbonyl group, the same alkyl groups as those described above can be used.

Examples of the halogen atom include a fluorine atom, a chlorine atom, a bromine atom and an iodine atom, and a fluorine atom is preferable.

It is preferable that $R^{00}$ and $R^{01}$ each independently represents a hydrogen atom or an alkyl group.

Specific example of the solvent represented by formula (1) (hereafter, frequently referred to as "solvent (1)") include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate and γ-butyrolactone.

Among the aforementioned examples, as the solvent (1), those in which $R^{00}$ and $R^{01}$ both represent an unsubstituted alkyl group is preferable, an alkyl acetate is more preferable, and butyl acetate is particularly desirable.

In formula (2), $R^{02}$ and $R^{04}$ are the same as defined for $R^{00}$ and $R^{01}$ described above.

The alkylene group for $R^{03}$ may be linear, branched or cyclic, preferably linear or branched, and preferably has 1 to 5 carbon atoms. The alkylene group may have a substituent. Examples of the substituent include a hydroxy group, a carboxy group and a cyano group. When the alkylene group has 2 or more carbon atoms, an oxygen atom (—O—) may be present between the carbon atoms within the alkylene group.

Specific example of the solvent represented by formula (2) (hereafter, frequently referred to as "solvent (2)") include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

The solvent (1) and/or (2) can be used individually, or at least 2 types of solvents may be mixed together. In particular, it is preferable to use the solvent (1) and the solvent (2) in combination as the EL margin and the like are improved.

As the solvent (1) or the solvent (2), one type of solvent may be used alone, or two or more types of solvents may be used in combination.

Alternatively, at least one of the solvent (1) and the solvent (2) may be mixed with another solvent.

The other solvent is not particularly limited as long as it can be mixed with the solvent (1) or (2) without being separated, and can be appropriately selected from the aforementioned ester solvents, ketone solvents, alcohol solvents, amide solvents, ether solvents and hydrocarbon solvents. Among these, glycol ether solvents such as glycol ether solvents containing a hydroxy group and a glycol ether solvent containing no hydroxy group (hereafter, frequently referred to collectively as "solvent (3)") are preferable, and a glycol ether solvent containing a hydroxy group, such as propylene glycol monomethyl ether is particularly desirable.

When the solvent (1) and the solvent (2) are mixed together, the (1)/(2) weight ratio is preferably 99/1 to 50/50, more preferably 95/5 to 60/40, and still more preferably 90/10 to 70/30.

When the solvent (1) and the solvent (3) are mixed together, the (1)/(3) weight ratio is preferably 99/1 to 50/50, more preferably 95/5 to 60/40, and still more preferably 90/10 to 70/30.

When the solvent (1), the solvent (2) and the solvent (3) are mixed together, the (1)/(2)/(3) weight ratio is preferably 90/0.1/9.6 to 50/15/35, more preferably 85/0.5/14.5 to 60/10/30, and still more preferably 80/1/19 to 70/5/25.

When 2 or more types of solvents (1) are mixed together, it is preferable to mix a chain-like ester solvent with a cyclic ester solvent. In such a case, the chain-like/cyclic weight ratio is preferably 99.9/0.1 to 80/20, more preferably 99.1 to 85/15, and still more preferably 98/2 to 90/10.

In terms of reducing the cost, it is preferable to use an organic solvent containing no halogen atom as the organic developing solution. The amount of the organic solvent containing no halogen atom, based on the total weight of the organic developing solvent is preferably 60% by weight or more, more preferably 80% by weight or more, still more preferably 90% by weight or more, and may be even 100% by weight.

The boiling point of the organic solvent used as the organic developing solution is preferably 50° C. to lower than 250° C.

The ignition point of the organic solvent used as the organic developing solution is preferably 200° C. or higher.

If desired, the organic developing solution may have a conventional additive blended. Examples of the additive include surfactants. The surfactant is not particularly limited, and for example, an ionic or non-ionic fluorine and/or silicon surfactant can be used.

Examples of commercially available surfactants include fluorine surfactants or silicon surfactants such as F Top EF301, EF303 (produced by Shinakita Kasei K.K.), Florad FC430, FC431 (produced by Sumitomo 3M), Megafac F171, F173, F176, F189, R08 (produced by Dainippon Ink And Chemicals, Incorporated), Surflon S-382, SC101, SC102, SC103, SC104, SC105, SC106 (Asahi Glass Company, Limited) and Troysol S-366 (troy chemical corporation). Further, polysiloxane polymer KP-341 (produced by The Shin-etsu Chemical Industry Co., Ltd.) can be used as a silicon surfactant.

Further, other than the aforementioned conventional surfactants, there can be used a surfactant containing a polymer having a fluoroaliphatic group derived from a fluoroaliphatic compound produced by a telomerization method (telomer method) or an oligomerization method (oligomer method). The fluoroaliphatic compound can be produced by a method described in Japanese Unexamined Patent Application, First Publication No. 2002-90991.

As the polymer containing a fluoroaliphatic group, a copolymer of a monomer containing a fluoroaliphatic group and a (poly(oxyalkylene)) acrylate and/or (poly(oxyalkylene)) methacrylate is preferable. The copolymer may be either a random copolymer or a block copolymer. Examples of the poly(oxyalkylene) group include a poly(oxyethylene group) a poly(oxypropylene) group and a poly(oxybutylene) group. Alternatively, a unit in which different types of alkylene chains exist within the same chain may be used, such as a poly(block linkage of oxyethylene, oxypropylene and oxyethylene) or a poly(block linkage of oxyethylene and oxypropylene). Furthermore, the copolymer of a monomer having a fluoroaliphatic group and a (poly(oxyalkylene))acrylate (or methacrylate) may not only be a bipolymer, but may be a terpolymer or more in which 2 or more types of monomers having a fluoroaliphatic group or 2 or more types of (poly(oxyalkylene))acrylate (or methacrylate) have been copolymerized together.

Examples of such surfactants which are commercially available include Megafac F178, Megafac F470, Megafac F473, Megafac F475, Megafac F476 and Megafac F472 (produced by Dainippon Ink And Chemicals, Incorporated). Further examples include a copolymer containing an acrylate (or a methacrylate) having a $C_6F_{13}$ group and a (poly(oxyalkylene)) acrylate (or methacrylate), a copolymer containing an acrylate (or a methacrylate) having a $C_6F_{13}$ group, a (poly(oxyethylene)) acrylate (or methacrylate) and a (poly(oxypropylene)) acrylate (or methacrylate), a copolymer containing an acrylate (or a methacrylate) having a $C_8F_{17}$ group and a (poly(oxyalkylene)) acrylate (or methacrylate), and a copolymer containing an acrylate (or a methacrylate) having a $C_8F_{17}$ group, a (poly(oxyethylene)) acrylate (or methacrylate) and a (poly(oxypropylene)) acrylate (or methacrylate)

As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The development treatment using the organic developing solution can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the developing treatment and before drying, it is preferable to perform a rinse treatment using a rinse liquid containing an organic solvent. By performing a rinse treatment, an excellent pattern can be formed.

As the organic solvent used for the rinse liquid, any of the aforementioned organic solvents for the organic developing solution can be used which hardly dissolves the pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the organic developing solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment (washing treatment) using the rinse liquid can be performed by a conventional rinse method. Examples thereof include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<<Negative Tone-development Resist Composition>>

The negative tone-development resist composition of the present invention includes a base component (A) (hereafter, referred to as component (A)) which exhibits reduced solubility in an organic solvent under action of an acid and an acid-generator component (B) (hereafter, referred to as component (B)) which generates an acid upon exposure, and is used in a method of forming a resist pattern including the steps of forming a resist film on a substrate using the resist composition, conducting exposure of the resist film, and patterning the resist film by a negative tone development using a developing solution containing an organic solvent.

In the resist composition, when radial rays are irradiated (when exposure is conducted), acid is generated from the component (B), and the solubility of the component (A) in an organic is decreased by the action of the generated acid. Therefore, in the formation of a resist pattern, by conducting selective exposure of a resist film formed by using the resist composition, the solubility of the exposed portions in a developing solution containing an organic solvent (hereafter, frequently referred to as "organic developing solution") is decreased, whereas the solubility of the unexposed portions in an organic developing solution is unchanged, and hence, a resist pattern can be formed by removing the unexposed portions by negative tone development using an organic developing solution.

<Component (A)>

In the present invention, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "polymeric compound" refers to a polymer having a molecular weight of 1,000 or more.

With respect to a polymeric compound, the "molecular weight" is the weight average molecular weight in terms of the polystyrene equivalent value determined by gel permeation chromatography (GPC).

[Resin Component (A1)]

In the present invention, the base component (A) includes a resin component (A1) (hereafter, referred to as component (A1)) containing a structural unit (a1) derived from an acrylate ester containing an acid decomposable group which exhibits increased hydrophilicity by the action of an acid and a structural unit (a0) derived from an acrylate ester containing an —$SO_2$— containing cyclic group.

The component (A1) may include a structural unit (a2) derived from an acrylate ester containing a lactone-containing cyclic group, as well as the structural units (a1) and (a0).

The component (A1) may include a structural unit (a3) derived from an acrylate ester containing a polar group-containing aliphatic hydrocarbon group, as well as the structural units (a1) and (a0), or the structural units (a1), (a0) and (a2).

The component (A1) may further include a structural unit (a4) derived from an acrylate ester containing an acid non-dissociable, aliphatic cyclic group.

(Structural Unit (a1))

The structural unit (a1) is a structural unit derived from an acrylate ester containing an acid decomposable group which exhibits increased hydrophilicity by the action of an acid In the present description and claims, the term "acid decomposable group" refers to a group in which at least a part of the bond within the structure thereof is cleaved by the action of an acid (acid generated from the component (B) upon exposure).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group.

A carbon atom on the α-position of an acrylate ester refers to the carbon atom bonded to the carbonyl group, unless specified otherwise.

With respect to the acrylate ester, specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms as a substituent on the α-position include groups in which part or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Examples of acid decomposable groups which exhibit increased hydrophilicity by the action of an acid include groups which is decomposed by the action of an acid to form a hydrophilic group.

Examples of the hydrophilic group include a carboxy group, a hydroxy group, an amino group and a sulfo group ($-SO_3H$). Among these, a carboxy group and a hydroxy group are preferable, and a carboxy group is particularly desirable.

Specific examples of the acid decomposable group include groups in which the aforementioned hydrophilic group has been substituted with an acid dissociable group.

An "acid dissociable group" is a group in which at least the bond between the acid dissociable group and the adjacent carbon atom is cleaved by the action of an acid (acid generated from the component (B) upon exposure). In the present invention, it is necessary that the acid dissociable group exhibits a lower hydrophilicity than the hydrophilic group formed by the dissociation of the acid dissociable group. Namely, by substituting the hydrogen atom of the hydrophilic group with an acid dissociable group, when the acid dissociable group is dissociated, the hydrophilic group is formed, thereby increasing the hydrophilicity. As a result, the hydrophilicity of the entire component (A1) is increased, so that the solubility of the component (A1) in an organic developing solution is relatively decreased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group ($-C(O)-O-$). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula $-C(R^{71})(R^{72})(R^{73})$ can be given (in the formula, each of $R^{71}$ to $R^{73}$ independently represents a linear alkyl group of 1 to 5 carbon atoms). The group represented by the formula $-C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom ($=O$).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantine, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 1]

(1-1)

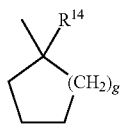
(1-2)

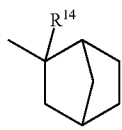
(1-3)

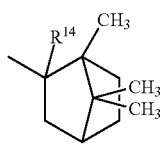
(1-4)

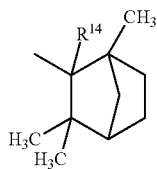
(1-5)

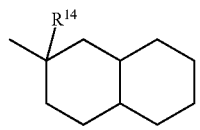
(1-6)

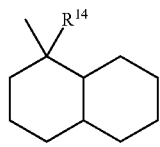
(1-7)

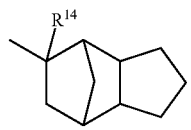
(1-8)

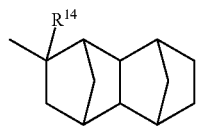
(1-9)

In the formulas above, $R^{14}$ represents an alkyl group; and g represents an integer of 0 to 8.

[Chemical Formula 2]

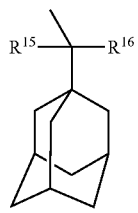
(2-1)

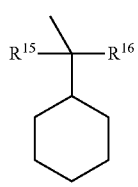
(2-2)

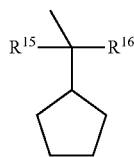
(2-3)

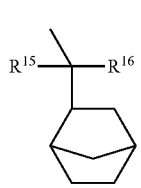
(2-4)

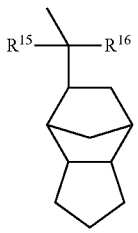

(2-5)

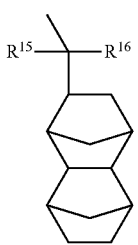

(2-6)

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of a hydrophilic group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded.

Examples of acetal-type acid dissociable groups include groups represented by general formula (p1) shown below.

[Chemical Formula 3]

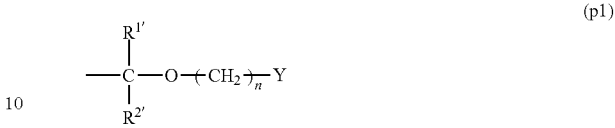

(p1)

In the formula, $R^{1\prime}$ and $R^{2\prime}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the lower alkyl group for $R^{1\prime}$ and $R^{2\prime}$, the same lower alkyl groups as those described above the alkyl groups as the substituent on the α-position of the aforementioned alkylester can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 4]

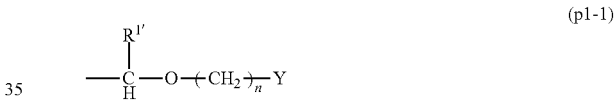

(p1-1)

In the formula, $R^{1\prime}$, n and Y are the same as defined above.

As the alkyl group for Y, the same alkyl groups as those described above the for the substituent on the α-position of the aforementioned alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 5]

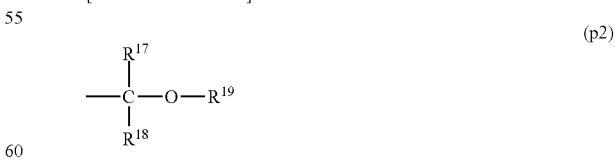

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of the structural unit (a1) include a structural unit represented by general formula (a1-0-1) shown below and a structural unit represented by general formula (a1-0-2) shown below.

[Chemical Formula 6]

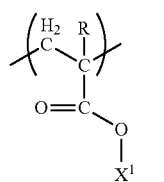
(a1-0-1)

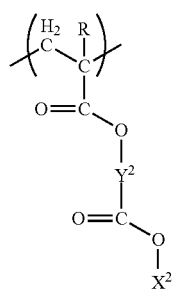
(a1-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent on the α-position of the aforementioned alkylester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above. $X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (═O).

As examples of the hydrocarbon group containing a ring in the structure thereof, an alicyclic hydrocarbon group (a group in which two hydrogen atoms have been removed from an aliphatic hydrocarbon ring), and a group in which the alicyclic hydrocarbon group is bonded to the terminal of the aforementioned chain-like aliphatic hydrocarbon group or interposed within the aforementioned chain-like aliphatic hydrocarbon group, can be given.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable.

The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group for $Y^2$ preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon groups such as —O—, —C(=O)—, —C(=O)—O—, a carbonate bond (—O—C(=O)—O—), —S—, —S(=O)$_2$—, —S(=O)$_2$—O—, —NH—, —NR$^{O4}$— (R$^{O4}$ represents a substituent such as an alkyl group or an acyl group), —NH—C(=O)— and =N—; and a combination of any one of these non-hydrocarbon groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

As the divalent linking group for $Y^2$, an alkylene group, a divalent alicyclic hydrocarbon group or a divalent linking group containing a hetero atom is preferable. Among these, an alkylene group or a divalent linking group containing a hetero atom is more preferable.

When $Y^2$ represents an alkylene group, it preferably has 1 to 10 carbon atoms, more preferably 1 to 6, still more preferably 1 to 4, and most preferably 1 to 3. Specific examples of allylene groups include the aforementioned linear alkylene groups and branched alkylene groups.

When $Y^2$ represents a divalent alicyclic hydrocarbon group, as the alicyclic hydrocarbon group, the same alicyclic hydrocarbon groups as those described above for the "aliphatic hydrocarbon group containing a ring in the structure thereof" can be used.

As the alicyclic hydrocarbon group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, preferable examples of the linking group include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by general formula -A-O—B—, -[A-C(=O)—O]$_{m'}$—B— or -A-O—C(=O)—B— [in the formulas, each of A and B independently represents a divalent hydrocarbon group which may have a substituent, O represents an oxygen atom, and m' represents an integer of 0 to 3].

When $Y^2$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and most preferably 1 to 5.

In the group represented by the formula -A-O—B—, -[A-C(=O)—O]$_{m'}$—B— or -A-O—C(=O)—B—, each of A and B independently represents a divalent hydrocarbon group which may have a substituent. As the divalent hydrocarbon group, the same groups as those described above for the "divalent hydrocarbon group which may have a substituent" for $Y^2$ can be mentioned.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—]$_{m'}$—B—, m represents an integer of 0 to 3, preferably an integer of 0 to 2, more preferably 0 or 1, and most preferably 1. Namely, it is particularly desirable that the group represented by the formula -[A-C(=O)—O]$_{m'}$—B— is a group represented by the formula -A-C(=O)—O—B—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula -A-O—B—, -[A-C(=O)—O]$_{m'}$—B— or -A-O—C(=O)—B— is more preferable.

Specific examples of the structural unit (a1) include structural units represented by general formulas (a1-1) to (a1-4) shown below.

[Chemical Formula 7]

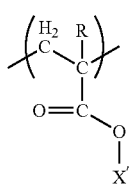
(a1-1)

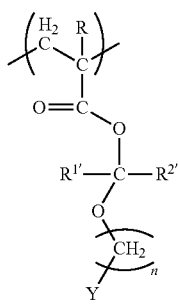
(a1-2)

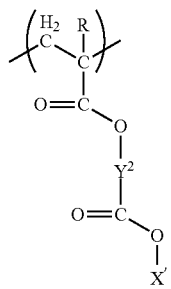
(a1-3)

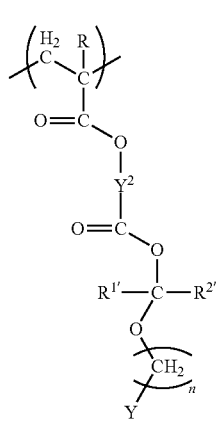
(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in general formula (p1) described above in connection with the "acetal-type acid dissociable group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 8]

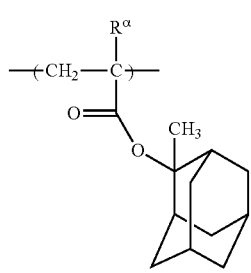
(a1-1-1)

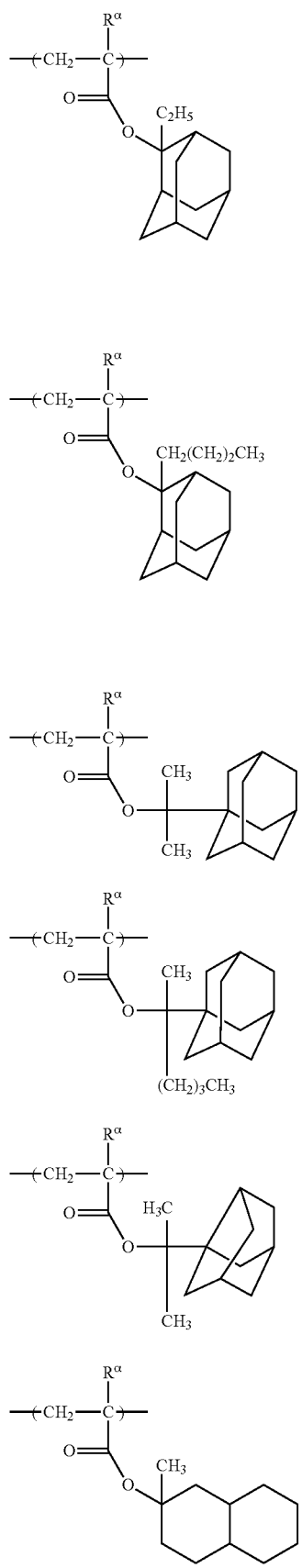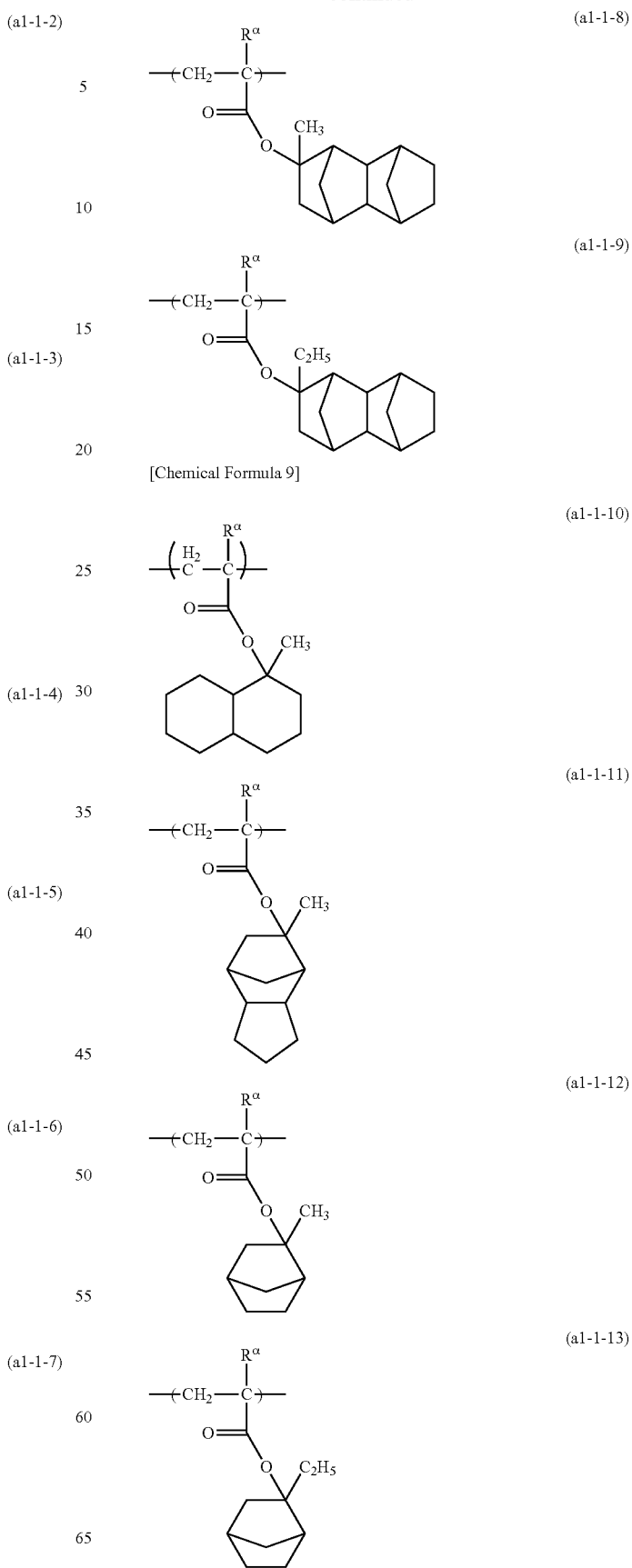

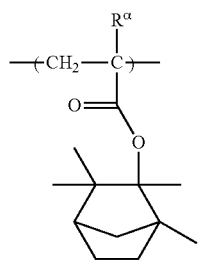 (a1-1-14)
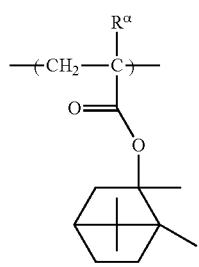 (a1-1-15)
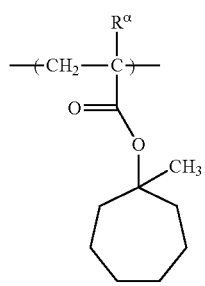 (a1-1-16)
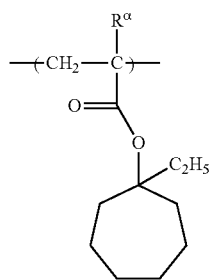 (a1-1-17)
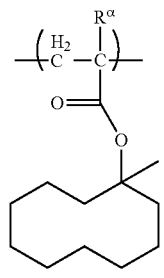 (a1-1-18)
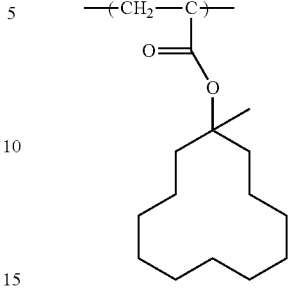 (a1-1-19)
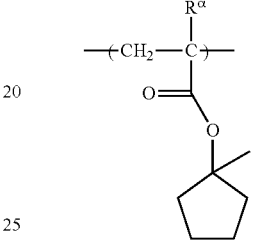 (a1-1-20)
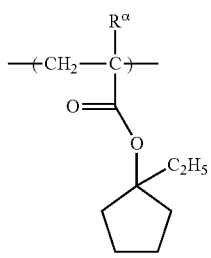 (a1-1-21)
[Chemical Formula 10]
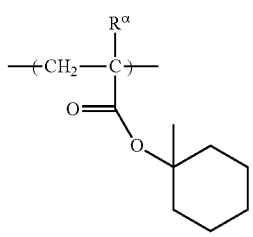 (a1-1-22)
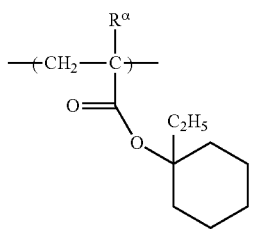 (a1-1-23)
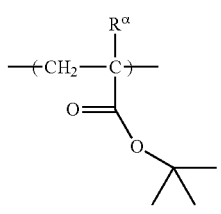 (a1-1-24)

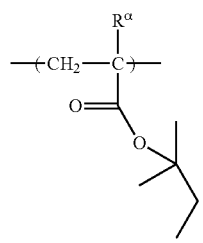 (a1-1-25)
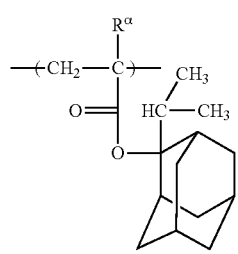 (a1-1-26)
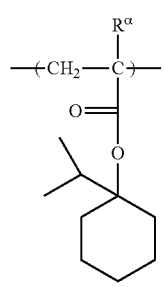 (a1-1-27)
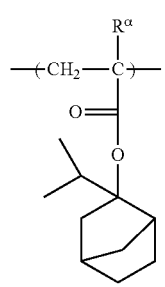 (a1-1-28)
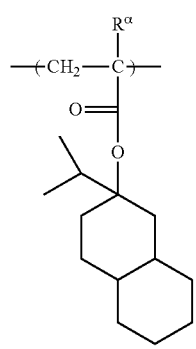 (a1-1-29)
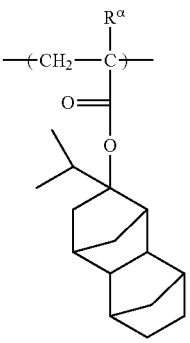 (a1-1-30)
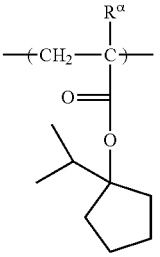 (a1-1-31)
[Chemical Formula 11]
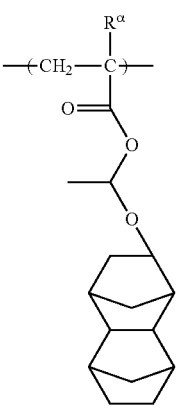 (a1-2-1)
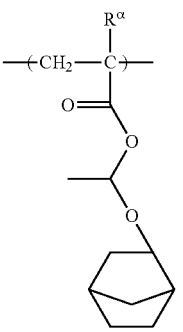 (a1-2-2)

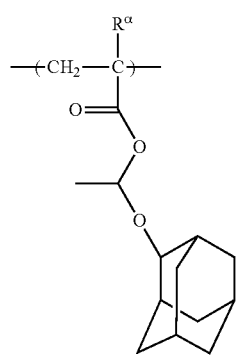
(a1-2-3)
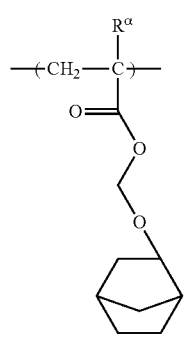
(a1-2-4)
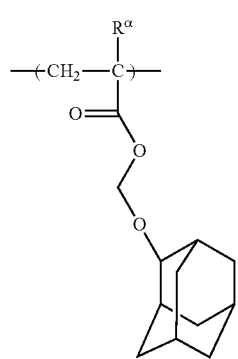
(a1-2-5)
(a1-2-6)
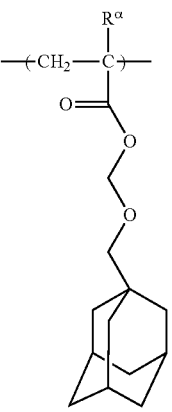
(a1-2-7)
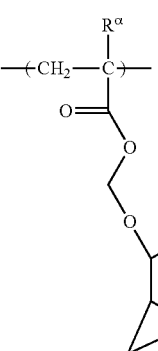
(a1-2-8)
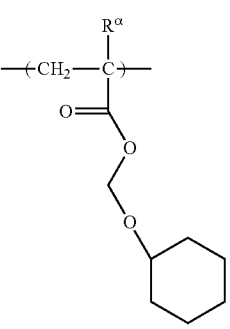
(a1-2-9)
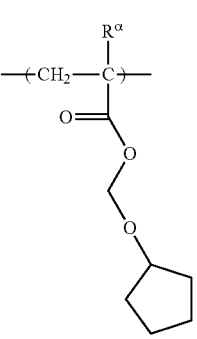
(a1-2-10)

(a1-2-11) 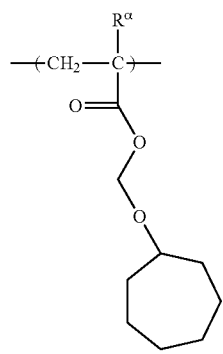
(a1-2-12) 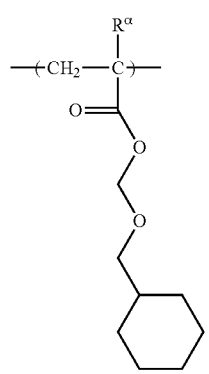
(a1-2-13) 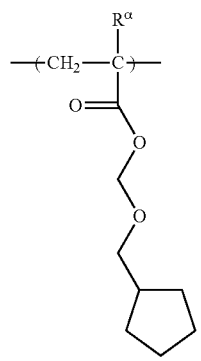
(a1-2-14) 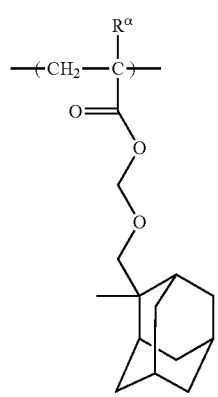
(a1-2-15) 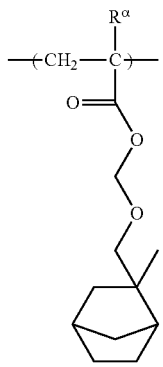
(a1-2-16) 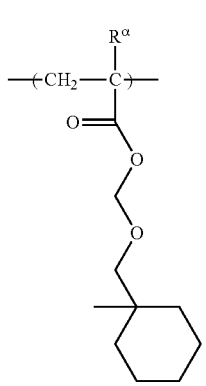
(a1-2-17) 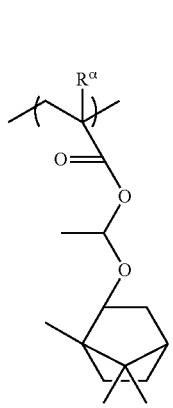
(a1-2-18) 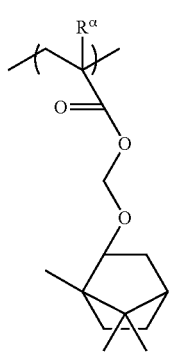

(a1-2-19)
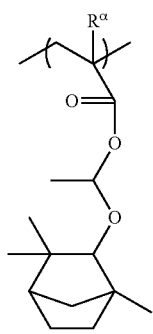
(a1-2-20)
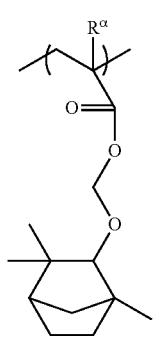
(a1-2-21)
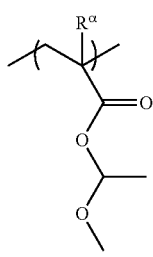
(a1-2-22)
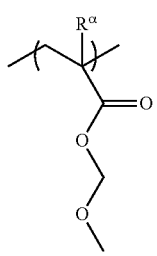
(a1-2-23)
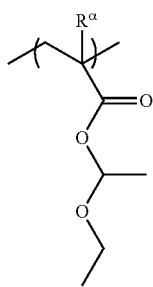
(a1-2-24)
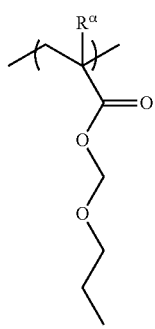
[Chemical Formula 12]
(a1-3-1)
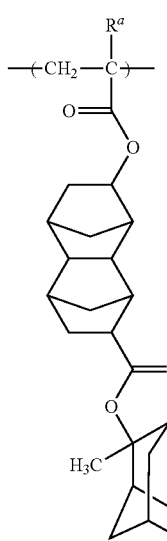
(a1-3-2)
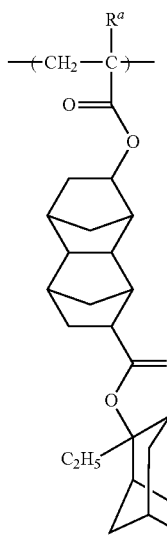

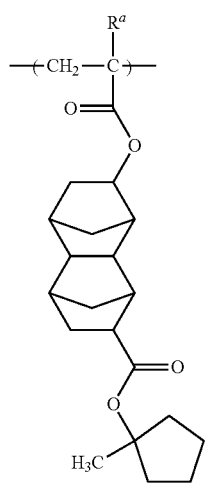
(a1-3-3)
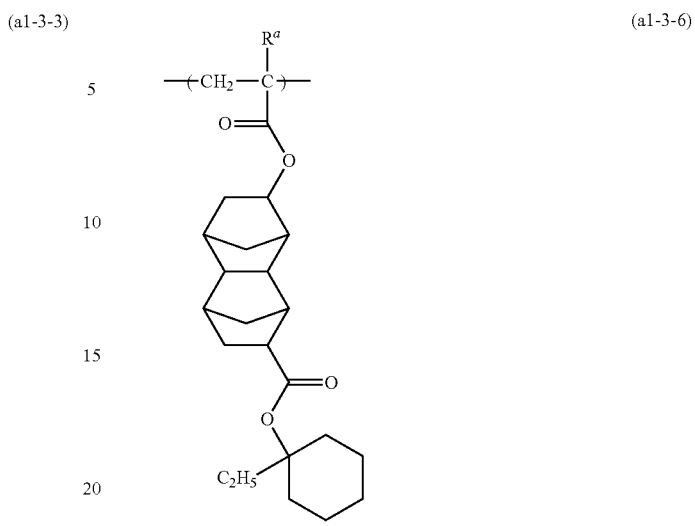
(a1-3-6)
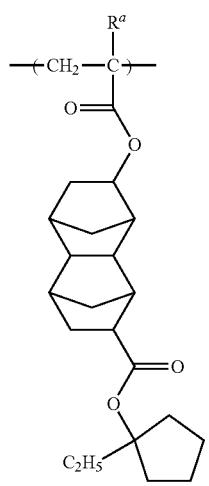
(a1-3-4)
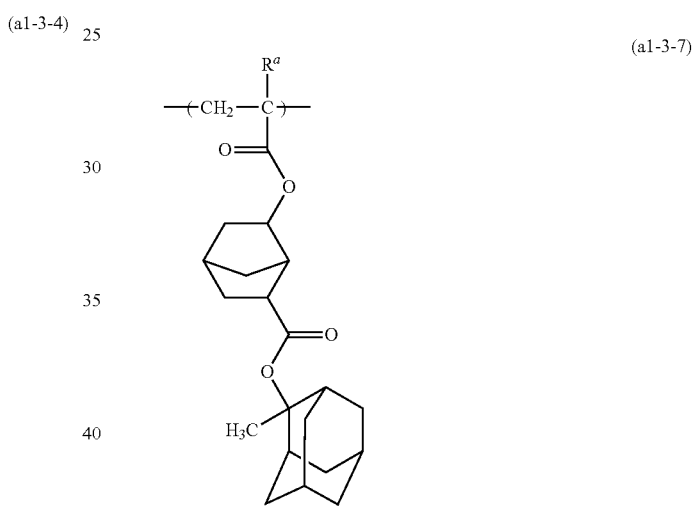
(a1-3-7)
(a1-3-5)
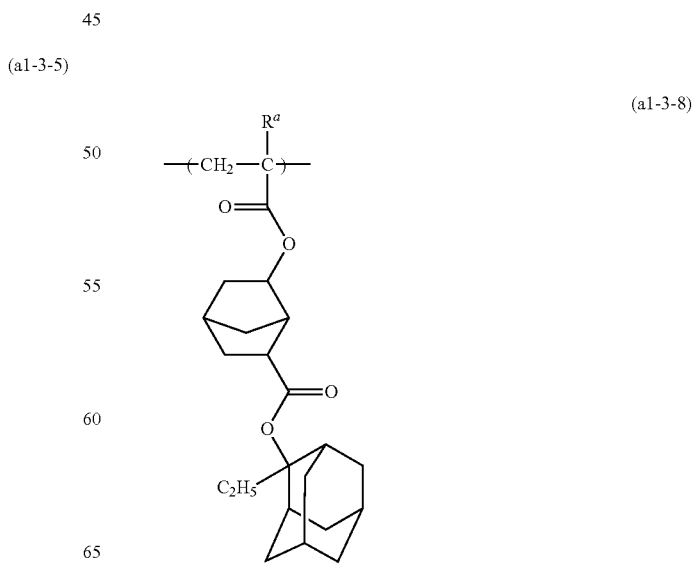
(a1-3-8)

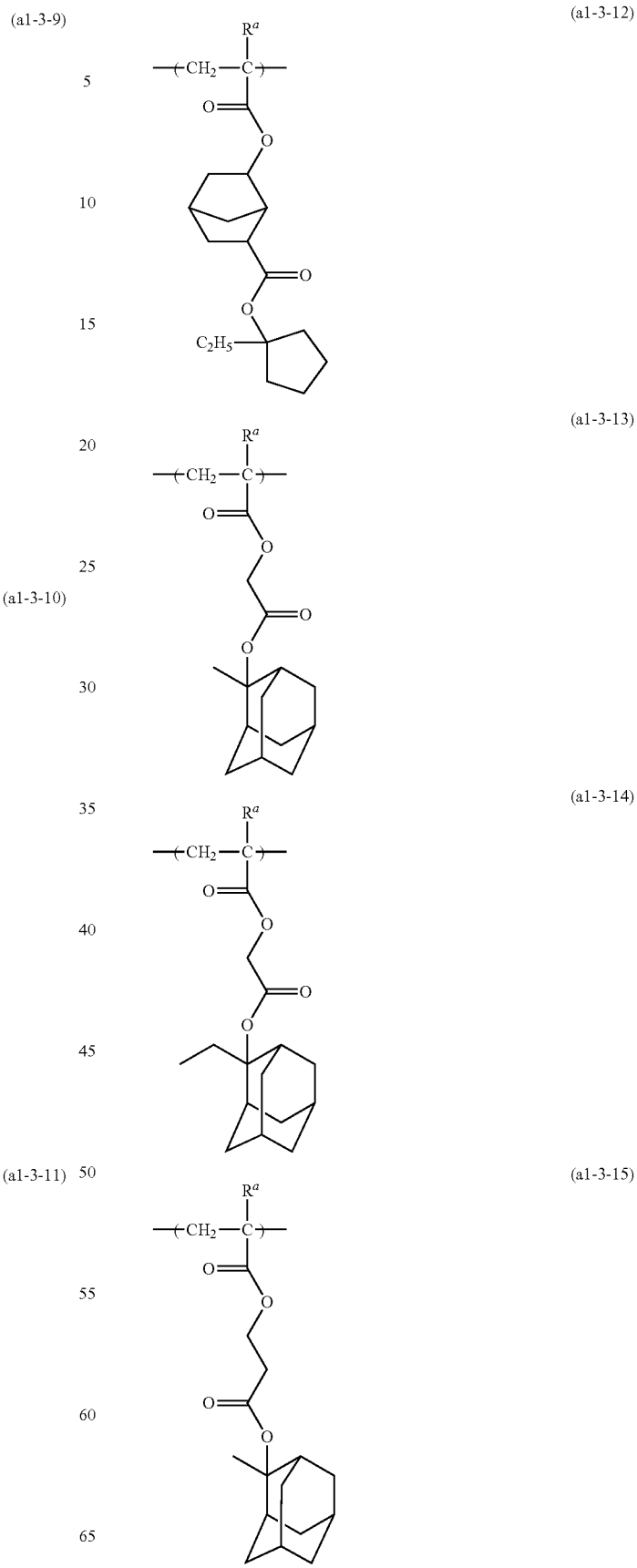

-continued
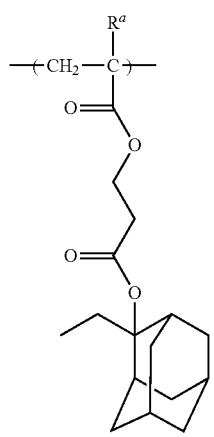 (a1-3-16)
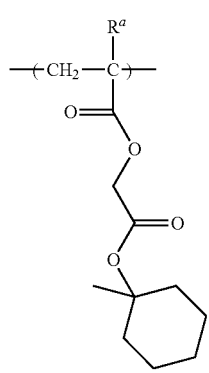 (a1-3-17)
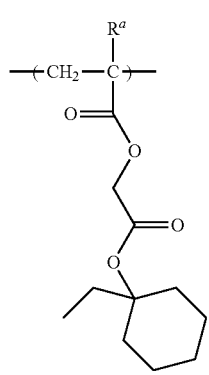 (a1-3-18)
[Chemical Formula 13]
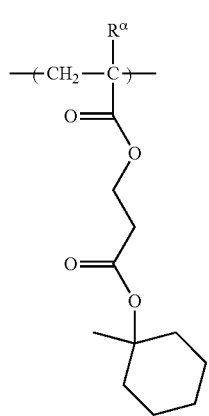 (a1-3-19)
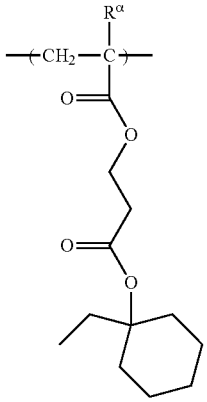 (a1-3-20)
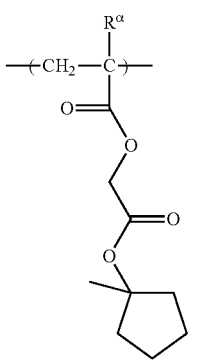 (a1-3-21)
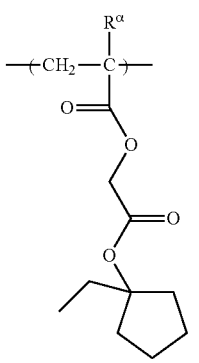 (a1-3-22)
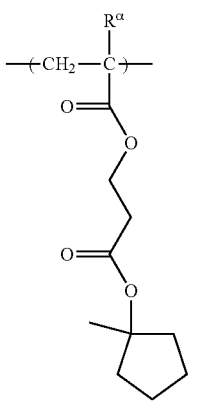 (a1-3-23)

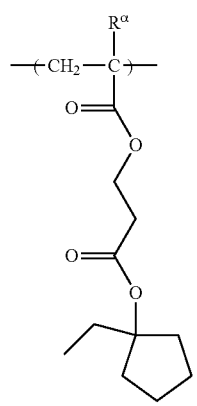
(a1-3-24)
[Chemical Formula 14]
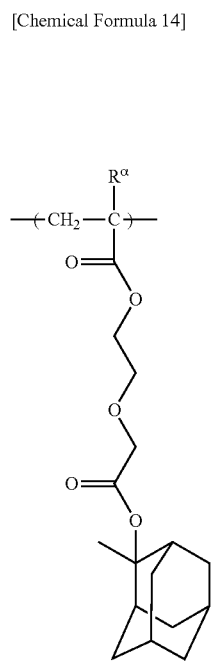
(a1-3-25)
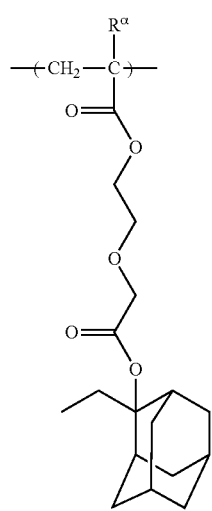
(a1-3-26)
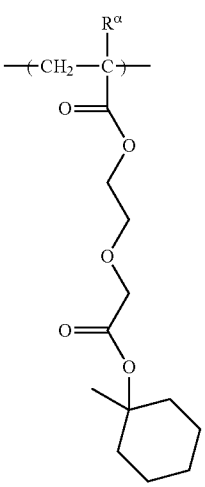
(a1-3-27)
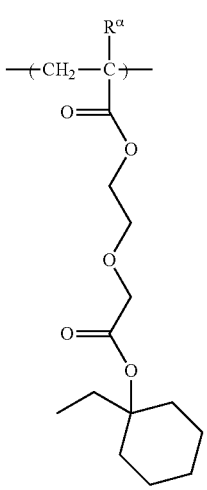
(a1-3-28)
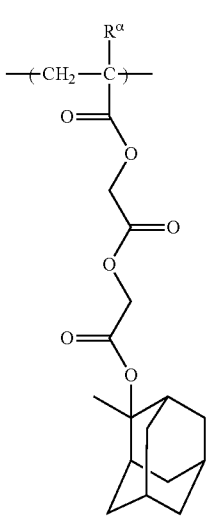
(a1-3-29)

(a1-3-30)
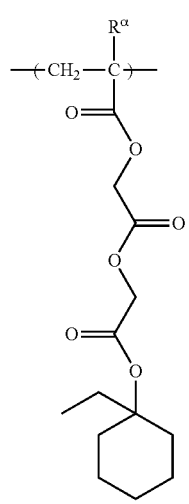
(a1-3-31)
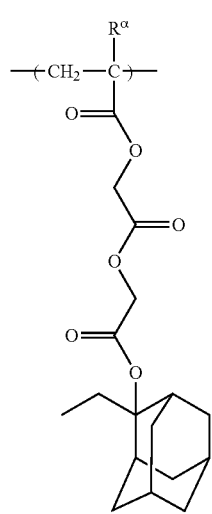
(a1-3-32)
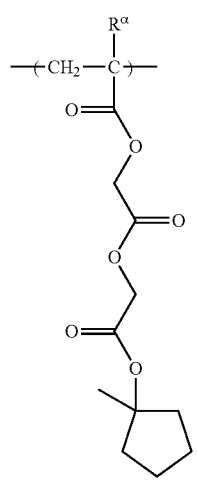
[Chemical Formula 15]
(a1-4-1)
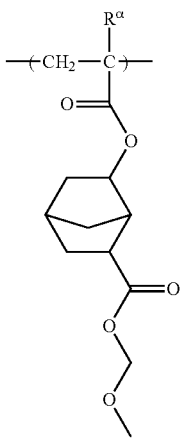
(a1-4-2)
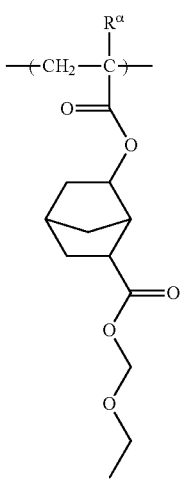
(a1-4-3)
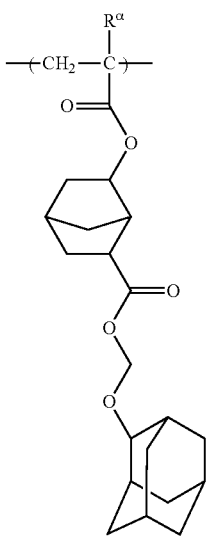

(a1-4-4)
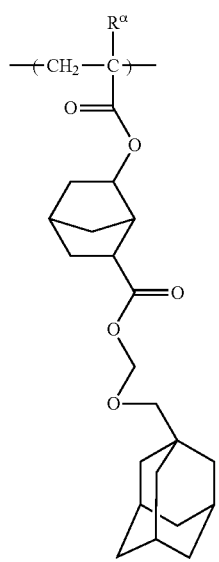
(a1-4-5)
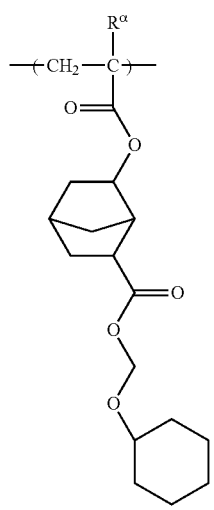
(a1-4-6)
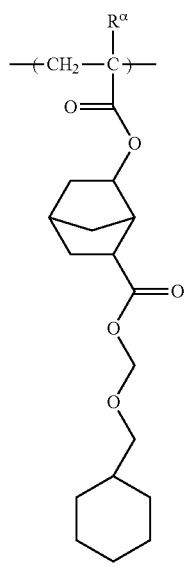
(a1-4-7)
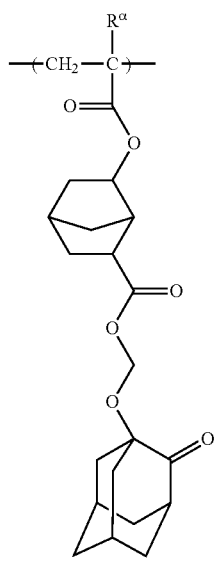
(a1-4-8)
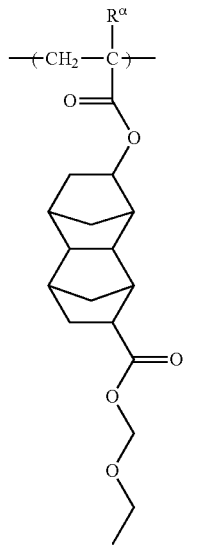
(a1-4-9)
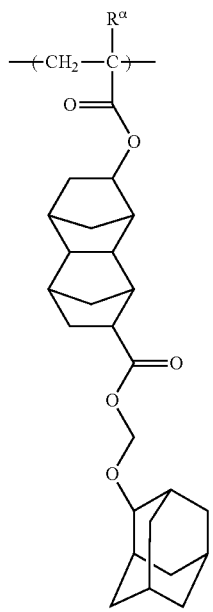

(a1-4-10)
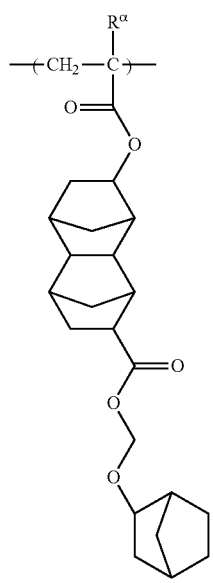
(a1-4-11)
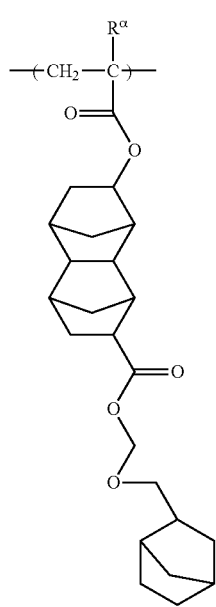
(a1-4-12)
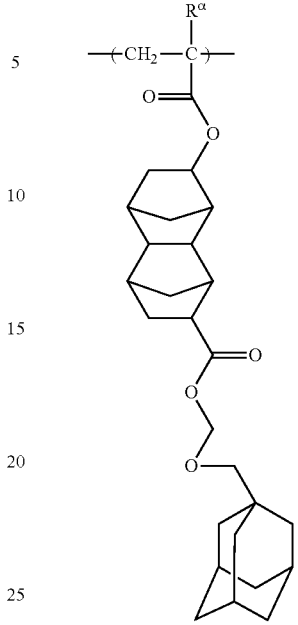
(a1-4-13)
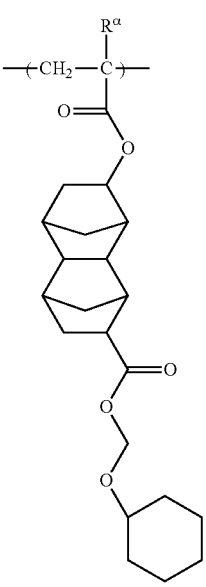

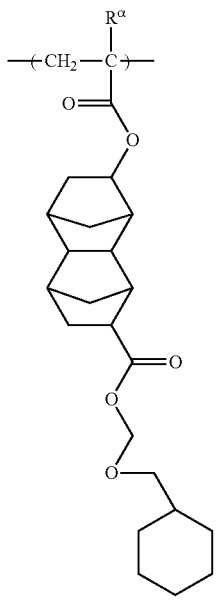

(a1-4-14)

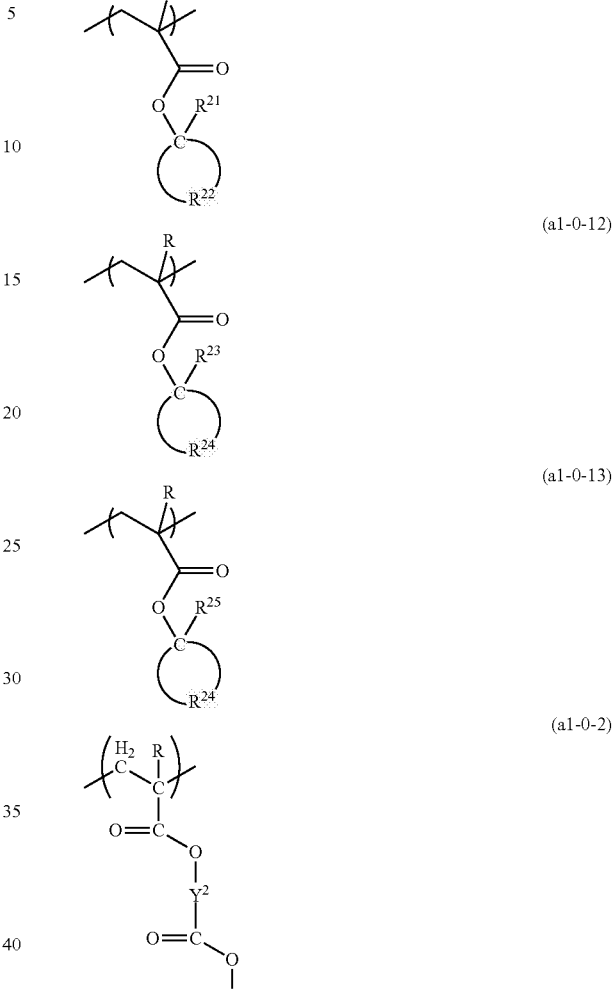

(a1-0-11)

(a1-0-12)

(a1-0-13)

(a1-0-2)

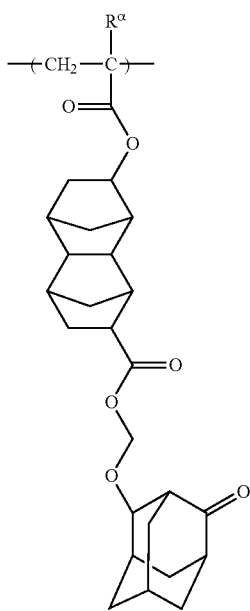

(a1-4-15)

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below and a structural unit represented by general formula (a1-0-2) shown below. It is particularly desirable that the structural unit (a1) include at least one member selected from the group consisting of a structural unit represented by general formula (a1-0-11) shown below, a structural unit represented by general formula (a1-0-12) shown below and a structural unit represented by general formula (a1-0-2) shown below.

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $R^{25}$ represents a linear alkyl group of 1 to 5 carbon atoms; $Y^2$ represents a divalent linking group; and $X^2$ represents an acid dissociable group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, preferably a methyl group, an ethyl group or an isopropyl group.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic cyclic group, an alkylene group which may have an ether bond (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, a structural unit represented by general formula (a1-1-02) shown below which includes the structural units represented by the aforementioned formulas (a1-1-16), (a1-1-17), (a1-1-20) to (a1-1-23), (a1-1-27) and (a1-1-31) is preferable. Further, a structural unit represented by general formula (a1-1-02') shown below is also preferable.

In the formulas, h is preferably 1 or 2.

[Chemical Formula 17]

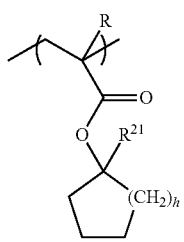

(a1-1-02)

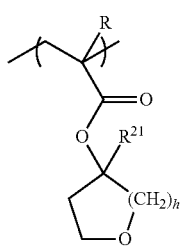

(a1-1-02')

In the formulas, R and $R^{21}$ are the same as defined above; and h represents an integer of 1 to 3.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable group and which are polycyclic can be used.

Specific examples of structural units represented by general formula (a1-0-12) include structural units represented by the aforementioned formulas (a1-1-26) and (a1-1-28) to (a1-1-30).

As the structural unit (a1-0-12), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1), (a1-1-2) and (a1-1-7) to (a1-1-15) which were described above as specific examples of the structural unit represented by general formula (a1-1).

As the structural unit (a1-0-13), a structural unit in which the aliphatic polycyclic group formed by $R^{24}$ and the carbon atom to which $R^{24}$ is bonded is a 2-adamantyl group is preferable, and a structural unit represented by the aforementioned formula (a1-1-1) or (a1-1-2) is particularly desirable.

Examples of structural units represented by general formula (a1-0-2) include structural units represented by the aforementioned formulas (a1-3) and (a1-4).

As a structural unit represented by general formula (a1-0-2), those in which $Y^2$ is a group represented by the aforementioned formula -A-O—B— or -A-C(=O)—O—B— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 18]

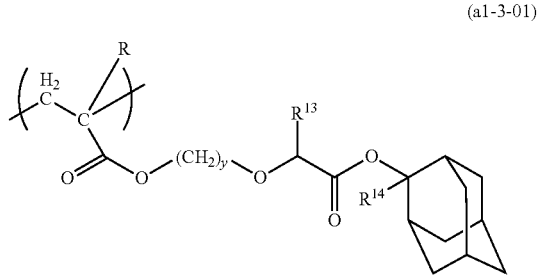

(a1-3-01)

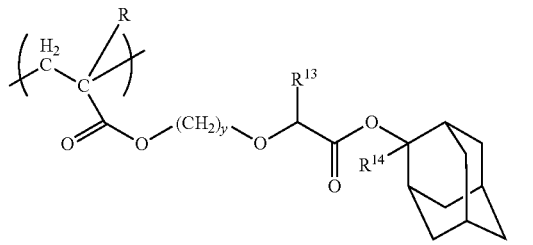

(a1-3-02)

In the formulas, R is the same as defined above; $R^{13}$ represents a hydrogen atom or a methyl group; $R^{14}$ represents an alkyl group; y represents an integer of 1 to 10; and n' represents an integer of 0 to 3.

[Chemical Formula 19]

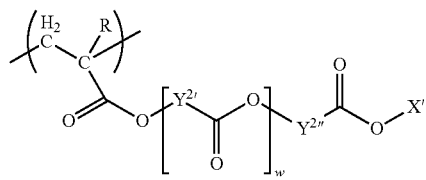

(a1-3-03)

In the formula, R is as defined above; each of $Y^{2'}$ and $Y^{2''}$ independently represents a divalent linking group; X' represents an acid dissociable group; and w represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

y is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group (i) in which a substituent is bonded to the carbon atom to which an atom adjacent to the acid dissociable group is bonded to on the ring skeleton to form a tertiary carbon atom. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 20]

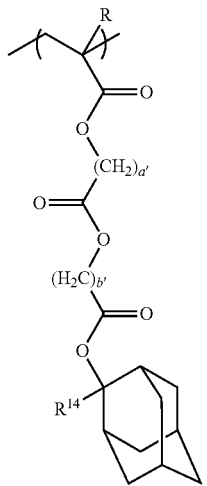

(a1-3-03-1)

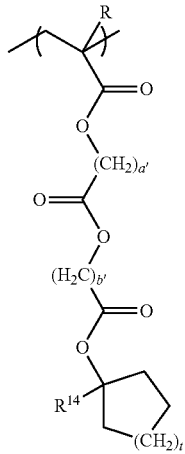

(a1-3-03-2)

In the formulas, R and $R^{14}$ are the same as defined above; a' represents an integer of 1 to 10; b' represents an integer of 1 to 10; and t represents an integer of 0 to 3.

In general formulas (a1-3-03-1) and (a1-3-03-2), a' is preferably an integer of 1 to 8, more preferably 1 to 5, and most preferably 1 or 2.

b' is preferably an integer of 1 to 8, more preferably 1 to 5, and most preferably 1 or 2.

t is preferably an integer of 1 to 3, and most preferably 1 or 2.

Specific examples of structural units represented by general formula (a1-3-03-1) or (a1-3-03-2) include structural units represented by the aforementioned formulas (a1-3-29) to (a1-3-32).

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %. When the amount of the structural unit (a1) is at least as large as the lower limit of the above-mentioned range, a pattern can be easily formed using a resist composition prepared from the component (A1), and various lithography properties such as sensitivity, resolution, LWR and the like are improved. On the other hand, when the amount of the structural unit (a1) is no more than the upper limit of the above-mentioned range, a good balance can be achieved with the other structural units.

(Structural Unit (a0))

The structural unit (a0) is a structural unit derived from an acrylate ester containing an —$SO_2$— containing cyclic group.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 21]

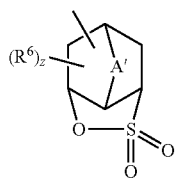
(3-1)

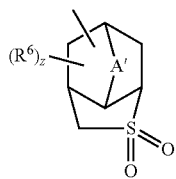
(3-2)

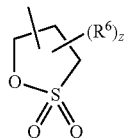
(3-3)

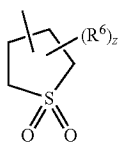
(3-4)

In the formulas, A' represents an oxygen atom, a sulfur atom or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of $R^6$ may be the same or different from, each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 22]

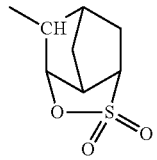
(3-1-1)

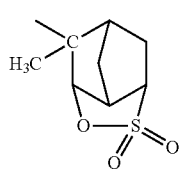
(3-1-2)

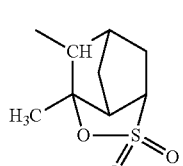
(3-1-3)

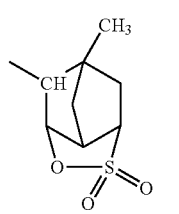
(3-1-4)

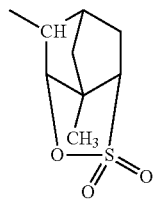
(3-1-5)

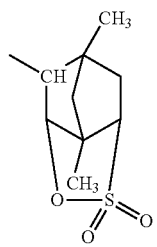
(3-1-6)

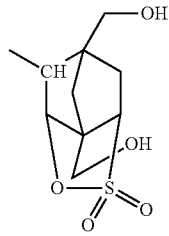
(3-1-7)

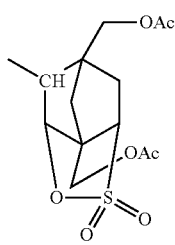 (3-1-8)
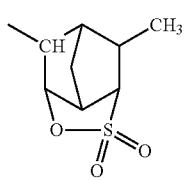 (3-1-9)
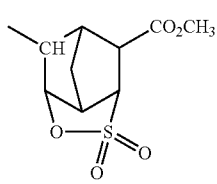 (3-1-10)
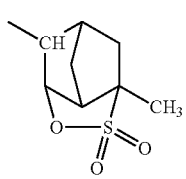 (3-1-11)
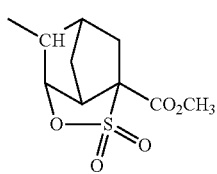 (3-1-12)
[Chemical Formula 23]
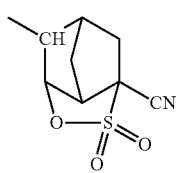 (3-1-13)
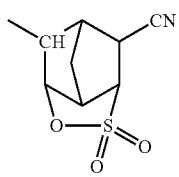 (3-1-14)
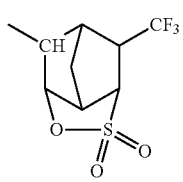 (3-1-15)
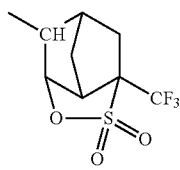 (3-1-16)
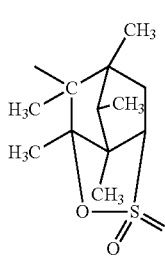 (3-1-17)
[Chemical Formula 24]
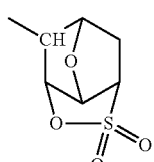 (3-1-18)
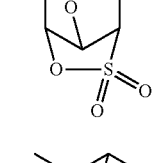 (3-1-19)
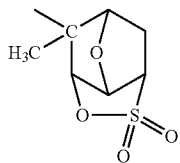 (3-1-20)
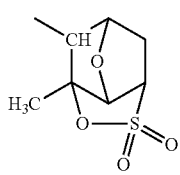 (3-1-21)
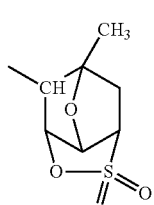 (3-1-22)
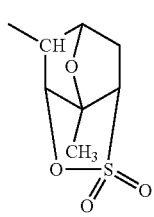

(3-1-23) 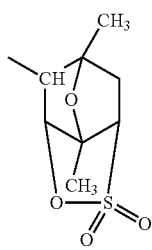

(3-1-24) 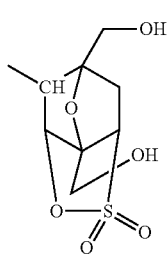

(3-1-25) 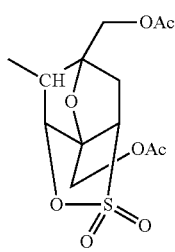

[Chemical Formula 25]

(3-1-26) 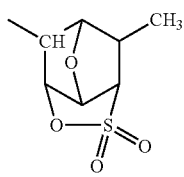

(3-1-27) 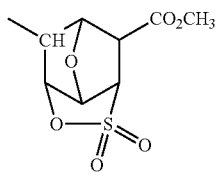

(3-1-28) 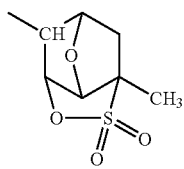

(3-1-29) 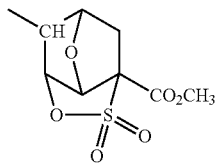

(3-1-30) 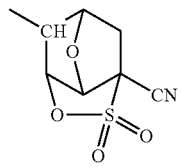

(3-1-31) 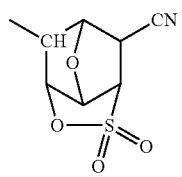

(3-1-32) 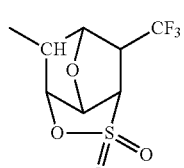

(3-1-33) 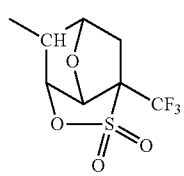

[Chemical Formula 26]

(3-2-1) 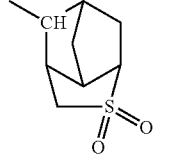

(3-2-2) 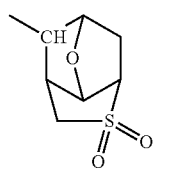

(3-3-1) 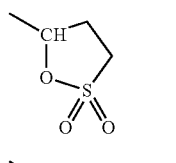

(3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specifically, examples of the structural unit (a0) include structural units represented by general formula (a0-1) shown below.

[Chemical Formula 27]

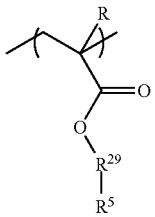

(a0-1)

In the formula, R represents a hydrogen atom, an alkyl group of 1 to 5 carbon atoms or a halogenated alkyl group of 1 to 5 carbon atoms; $R^5$ represents a —$SO_2$— containing cyclic group; and $R^{29}$ represents a single bond or a divalent linking group.

In genera formula (a0-1), R is the same as defined above.

$R^5$ is the same as defined for the aforementioned —$SO_2$— containing group.

$R^{29}$ may be either a single bond or a divalent linking group. In terms of the effects of the present invention, a divalent linking group is preferable.

The divalent linking group for $R^{29}$ is not particularly limited. For example, the same divalent linking groups as those described for $Y^2$ in general formula (a1-0-2) explained above in relation to the structural unit (a1) can be mentioned. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^4$—C(=O)—O— (in the formula, $R^4$ represents a divalent linking group) is particularly desirable. Namely, the structural unit (a0) is preferably a structural unit represented by general formula (a0-11) shown below.

[Chemical Formula 28]

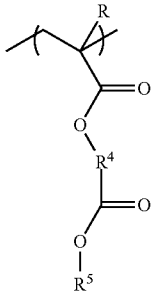

(a0-11)

In the formula, R and $R^5$ are the same as defined above; and $R^4$ represents a divalent linking group.

$R^4$ is not particularly limited. For example, the same divalent linking groups as those described for $Y^2$ in general formula (a1-0-2) explained above in relation to the structural unit (a1) can be mentioned.

As the divalent linking group for $R^4$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $Y^2$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH($CH_3$)—, —C($CH_3$)$_2$— or —C($CH_3$)$_2$$CH_2$— is particularly desirable.

As the divalent linking group containing a hetero atom, a divalent linking group containing an ether bond or an ester bond is preferable, and a group represented by the aforementioned formula -A-O—B—, -[A-C(=O)—O]$_{m'}$—B— or -A-O—C(=O)—B— is more preferable.

Among these, a group represented by the formula -A-O—C(=O)—B— is preferable, and a group represented by the formula: —($CH_2$)$_c$—C(=O)—O—($CH_2$)$_d$— is particularly desirable. c represents an integer of 1 to 5, and preferably 1 or 2. d represents an integer of 1 to 5, and preferably 1 or 2.

In particular, as the structural unit (a0), a structural unit represented by general formula (a0-21) or (a0-22) shown below is preferable, and a structural unit represented by general formula (a0-22) is more preferable.

[Chemical Formula 29]

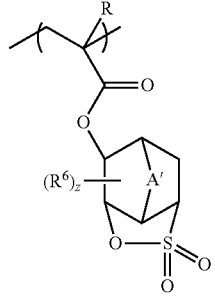

(a0-21)

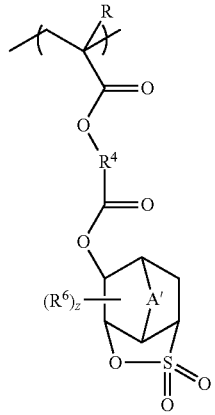

(a0-22)

In the formulas, R, A', $R^6$, z and $R^4$ are the same as defined above.

In general formula (a0-21), A' is preferably a methylene group, an oxygen atom (—O—) or a sulfur atom (—S—).

As R⁴, a linear or branched alkylene group or a divalent linking group containing an oxygen atom is preferable. As the linear or branched alkylene group and the divalent linking group containing an oxygen atom represented by R⁴, the same linear or branched alkylene groups and the divalent linking groups containing an oxygen atom as those described above can be mentioned.

As the structural unit represented by general formula (a0-22), a structural unit represented by general formula (a0-22a) or (a0-22b) shown below is particularly desirable.

[Chemical Formula 30]

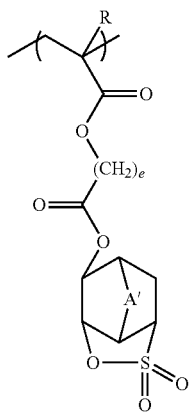
(a0-22a)

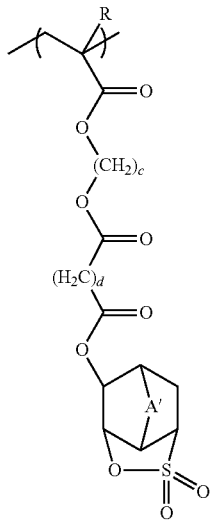
(a0-22b)

In the formulas, R and A' are the same as defined above; and each of c to e independently represents an integer of 1 to 3.

As the structural unit (a0) contained in the component (A1), 1 type of structural unit may be used, or 2 or more types may be used.

The amount of the structural unit (a0) within the component (A1) based on the combined total of all structural units constituting the component (A1) is preferably 5 to 60 mol %, more preferably 10 to 50 mol %, and still more preferably 15 to 40 mol %. By ensuring the lower limit, various lithography properties such as sensitivity, resolution and LWR are improved. By ensuring the upper limit, a good balance can be achieved with the other structural units, and the solubility in an organic solvent is satisfactory.

(Structural Unit (a2))

The structural unit (a2) is a structural unit derived from an acrylate ester containing a lactone-containing cyclic group. When the component (A1) includes the structural unit (a2), the hydrophilicity of the component (A1) is enhanced, and various lithography properties such as adhesion, sensitivity, resolution and LWR are improved.

The term "lactone-containing cyclic group" refers to a cyclic group including a ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2) include structural units represented by the aforementioned general formula (a2-0) in which the R⁵ group has been substituted with a lactone-containing cyclic group. Specific examples include structural units represented by general formulas (a2-1) to (a2-5) shown below.

[Chemical Formula 31]

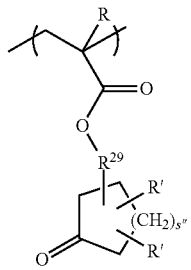
(a2-1)

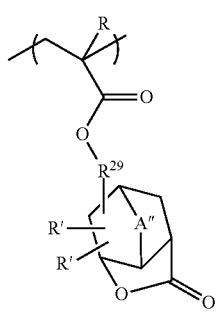
(a2-2)

-continued

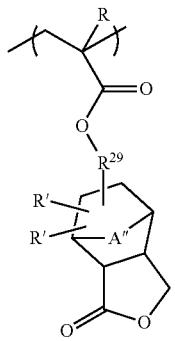
(a2-3)

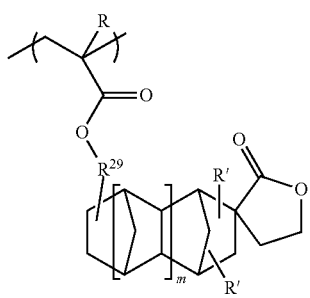
(a2-4)

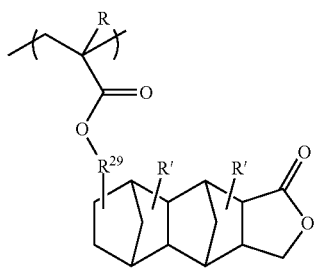
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in general formula (a0-1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ is the same as defined for $R^{29}$ in the aforementioned general formula (a0-1).

In formula (a2-1), s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 32]

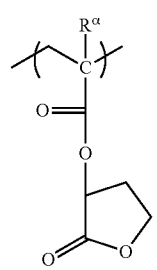
(a2-1-1)

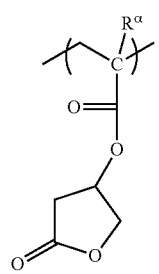
(a2-1-2)

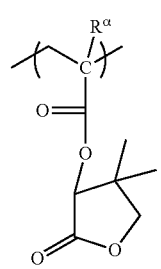
(a2-1-3)

(a2-1-4) 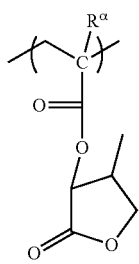
(a2-1-5) 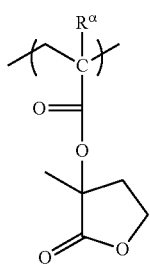
(a2-1-6) 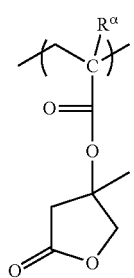
(a2-1-7) 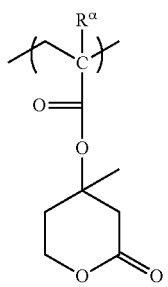
(a2-1-8) 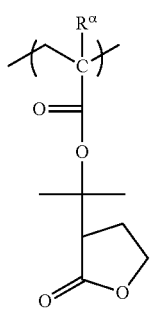
(a2-1-9) 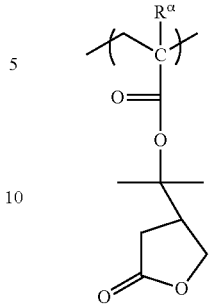
(a2-1-10) 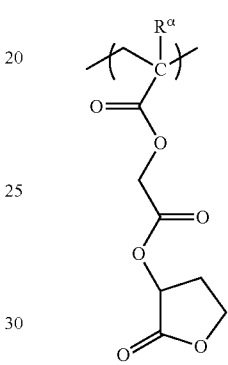
(a2-1-11) 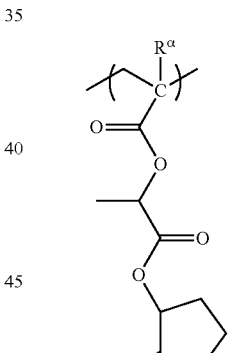
(a2-1-12) 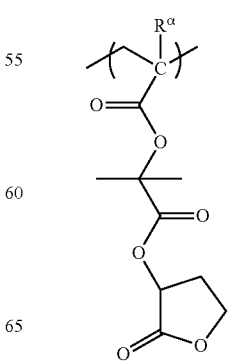

(a2-1-13)
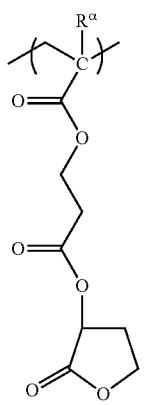
[Chemical Formula 33]
(a2-2-1)
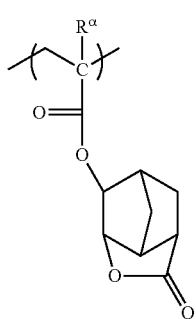
(a2-2-2)
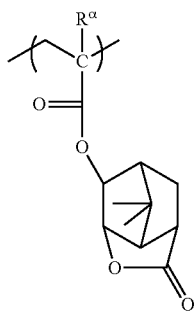
(a2-2-3)
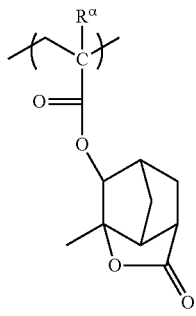
(a2-2-4)
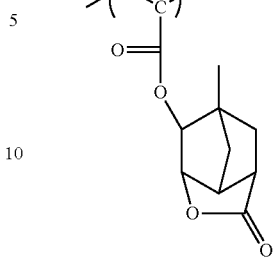
(a2-2-5)
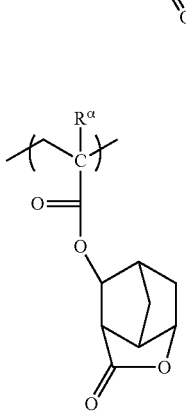
(a2-2-6)
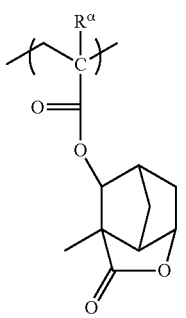
(a2-2-7)
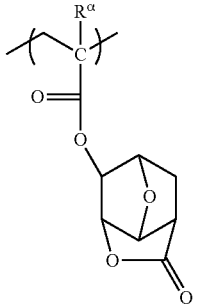
(a2-2-8)
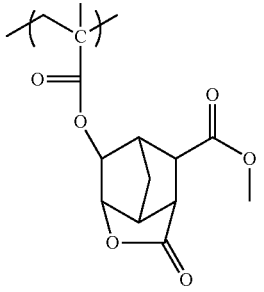

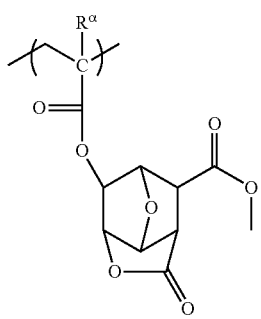
(a2-2-9)
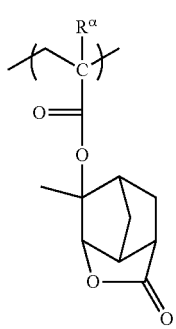
(a2-2-10)
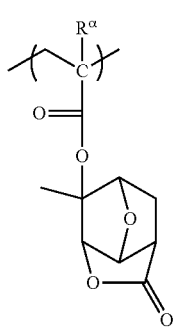
(a2-2-11)
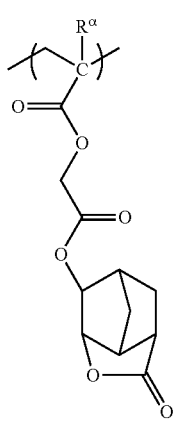
(a2-2-12)
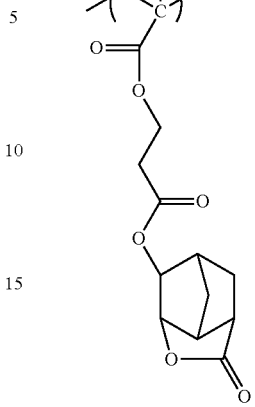
(a2-2-13)
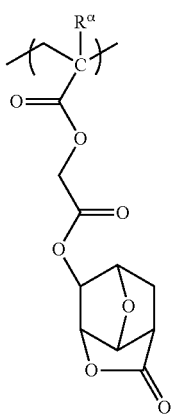
(a2-2-14)
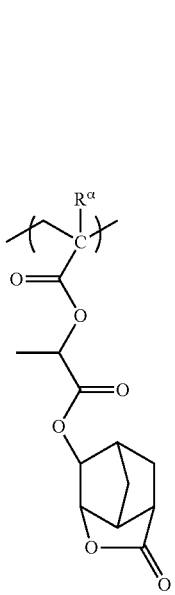
(a2-2-15)

-continued
(a2-2-16)
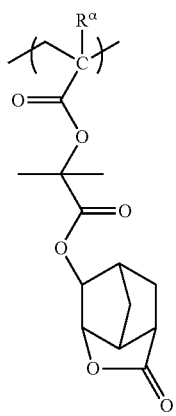
(a2-2-17)
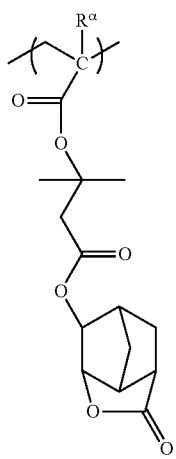
[Chemical Formula 34]
(a2-3-1)
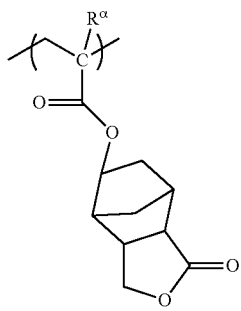
(a2-3-2)
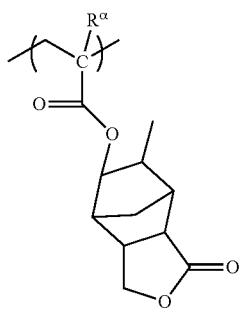
-continued
(a2-3-3)
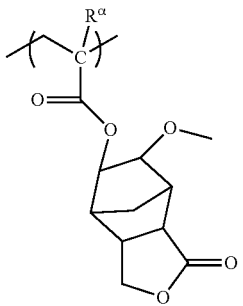
(a2-3-4)
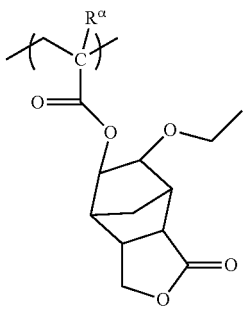
(a2-3-5)
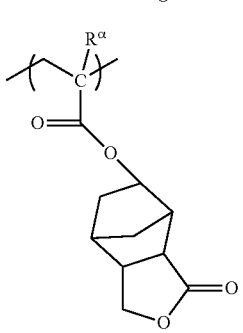
Chemical Formula 35
(a2-4-1)
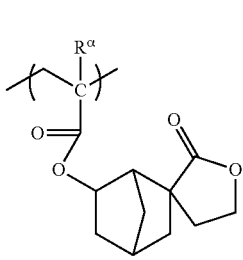
(a2-4-2)
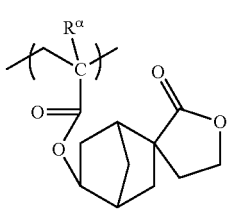
(a2-4-3)
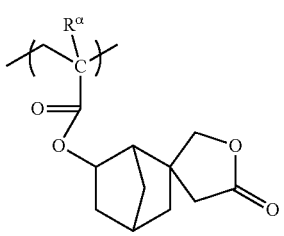

-continued
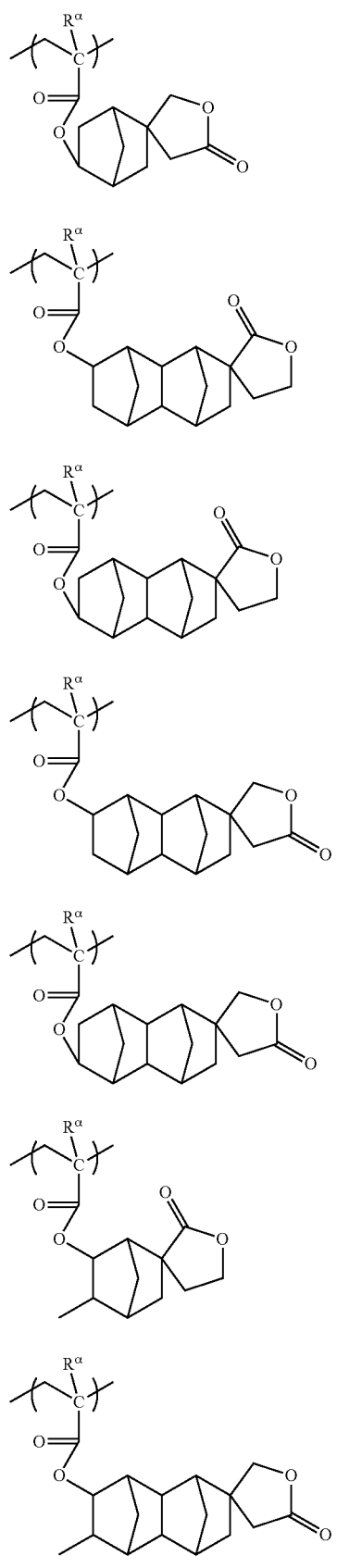
(a2-4-4)
(a2-4-5)
(a2-4-6)
(a2-4-7)
(a2-4-8)
(a2-4-9)
(a2-4-10)
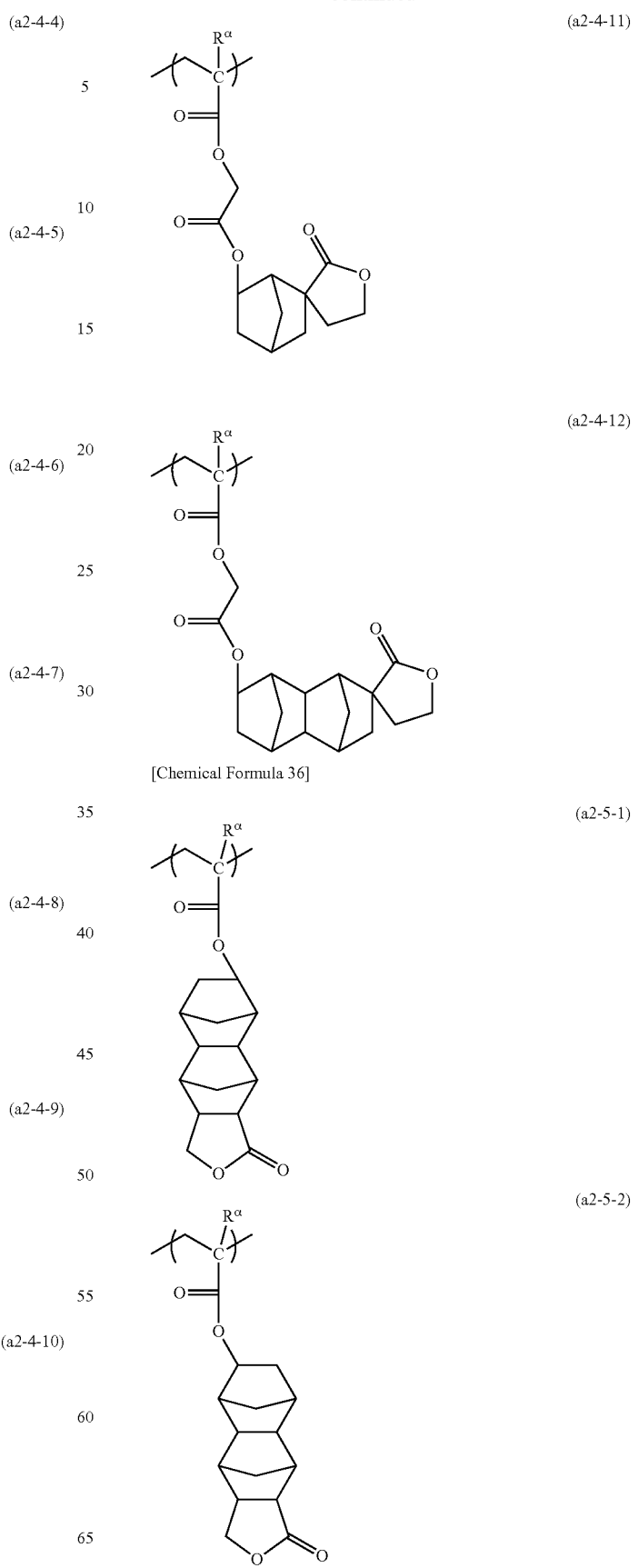
(a2-4-11)
(a2-4-12)
[Chemical Formula 36]
(a2-5-1)
(a2-5-2)

-continued (a2-5-3)

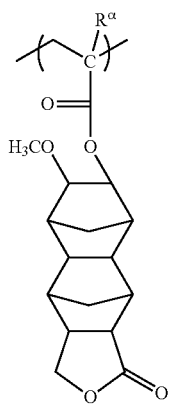

(a2-5-4)

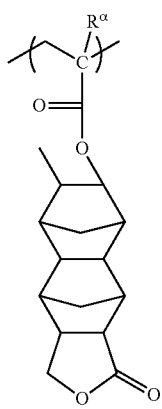

(a2-5-5)

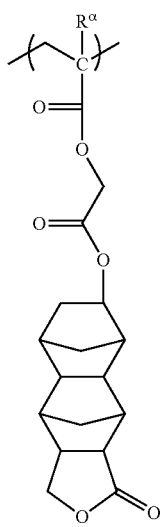

-continued (a2-5-6)

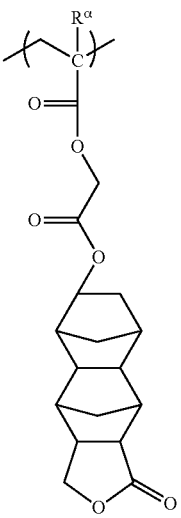

As the structural unit (a2), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

Specifically, it is preferable to use at least one structural unit selected from the group consisting of formulas (a2-1-1), (a2-1-2), (a2-2-1), (a2-2-7), (a2-2-12), (a2-2-14), (a2-3-1) and (a2-3-5).

As the structural unit (a2) contained in the component (A1), 1 type of structural unit may be used, or 2 or more types may be used.

The amount of the structural unit (a2) within the component (A1) based on the combined total of all structural units constituting the component (A1) is preferably 5 to 60 mol %, more preferably 10 to 50 mol %, and still more preferably 15 to 40 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties can be improved.

(Structural Unit (a3))

The structural unit (a3) is a structural unit derived from an acrylate ester containing a polar group-containing aliphatic hydrocarbon group. When the component (A1) includes the structural unit (a3), the hydrophilicity of the component (A1) is enhanced, and various lithography properties such as sensitivity, resolution, LWR and EL are improved.

The structural unit (a3) does not fall under the category of the aforementioned structural units (a0) to (a2). That is, a "structural unit derived from an acrylate ester containing a polar group-containing aliphatic hydrocarbon group" which falls under the category of the aforementioned structural units (a0) to (a2) is not classified as the structural unit (a3).

Examples of the polar group include a hydroxy group, a cyano group, a carboxy group and a fluorinated alcohol group (a hydroxyalkyl group in which part of the hydrogen atoms bonded to carbon atoms have been substituted with fluorine atoms).

Among these, a hydroxy group or a carboxy group is preferable, and a hydroxy group is particularly desirable.

In the structural unit (a3), the number of polar groups bonded to the aliphatic hydrocarbon group is not particularly limited, although 1 to 3 groups is preferable, and 1 group is particularly desirable.

The aliphatic hydrocarbon group to which the polar group is bonded may be either saturated or unsaturated, preferably saturated.

As specific examples of the aliphatic hydrocarbon group, a linear or branched aliphatic hydrocarbon group, and an aliphatic hydrocarbon group containing a ring in the structure thereof can be given.

The "linear or branched aliphatic hydrocarbon group" preferably has 1 to 12 carbon atoms, more preferably 1 to 10, still more preferably 1 to 8, and still more preferably 1 to 6.

The linear or branched aliphatic hydrocarbon group may have part or all of the hydrogen atoms substituted with a substituent other than a polar group. Examples of the substituent include a fluorine atom, a fluorinated alkyl group of 1 to 5 carbon atoms, and an oxygen atom (=O). Further, the linear or branched aliphatic hydrocarbon group may have a divalent group containing a hetero atom present between the carbon atoms. Examples of the "divalent group containing a hetero atom" include the same groups as those described for the "divalent linking group containing a hetero atom" as the divalent linking group represented by $Y^2$ explained above in relation to the structural unit (a1).

When the aliphatic hydrocarbon group is linear or branched, as the structural unit (a3), a structural unit represented by general formula (a3-1) or (a3-2) shown below is preferable.

[Chemical Formula 37]

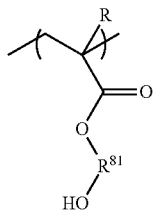
(a3-1)

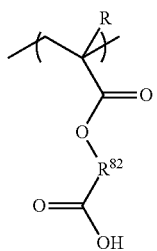
(a3-2)

In the formulas, R is the same as defined above; $R^{81}$ represents a linear or branched alkylene group; and $R^{82}$ represents an alkylene group which may have a divalent group containing a hetero atom present therein.

In general formula (a3-1), the alkylene group for $R^{81}$ preferably has 1 to 12 carbon atoms, and more preferably 1 to 10.

In general formula (a3-2), the alkylene group for $R^{82}$ preferably has 1 to 12 carbon atoms, more preferably 1 to 10, and most preferably 1 to 6.

When the alkylene group has 2 or more carbon atoms, the alkylene group may have a divalent group containing a hetero atom present between the carbon atoms. Examples of the "divalent group containing a hetero atom" include the same groups as those described for the "divalent linking group containing a hetero atom" as the divalent linking group represented by $Y^2$ explained above in relation to the structural unit (a1).

As $R^{82}$, an alkylene group having no divalent group containing a hetero atom, or an alkylene group having a divalent linking group containing an oxygen atom as a hetero atom present therein is particularly desirable.

As the alkylene group having a divalent group containing an oxygen atom present therein, a group represented by the formula -A-O—B— or -A-O—C(=O)—B— is preferable. In the formulas, each of A and B independently represents a divalent hydrocarbon group which may have a substituent, and the same groups as those described for A and B in the formulas -A-O—B— and -A-O—C(=O)—B— explained above in relation to the structural unit (a1) can be mentioned.

Among these, a group represented by the formula -A-O—C(=O)—B— is preferable, and a group represented by the formula —(CH$_2$)$_f$—O—C(=O)—(CH$_2$)$_{g'}$— (in the formula, each of f and g' independently represents an integer of 1 to 3) is more preferable.

As examples of the "hydrocarbon group containing a ring in the structure thereof", a cyclic aliphatic hydrocarbon group, and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 30 carbon atoms. Further, the cyclic aliphatic hydrocarbon group may be either a polycyclic group or a monocyclic group, and is preferably a polycyclic group.

Specifically, the cyclic aliphatic hydrocarbon group can be selected appropriately from the multitude of groups that have been proposed for the resins of resist compositions designed for use with ArF excimer lasers. As the monocyclic aliphatic hydrocarbon group, a group in which two hydrogen atoms have been removed from a monocycloalkane of 3 to 20 carbon atoms is preferable. Examples of the monocycloalkane include cyclopentane and cyclohexane. As the polycyclic aliphatic hydrocarbon group, a group in which two hydrogen atoms have been removed from a polycycloalkane of 7 to 30 carbon atoms is preferable. Examples of the polycycloalkane include adamantane, norbornane, isobornane, tricyclodecane and tetracyclododecane.

The cyclic aliphatic hydrocarbon group may have part or all of the hydrogen atoms substituted with a substituent other than a polar group. Examples of the substituent include an alkyl group of 1 to 5 carbon atoms, a fluorine atom, a fluorinated alkyl group of 1 to 5 carbon atoms, and an oxygen atom (=O).

When the aliphatic hydrocarbon group contains a ring in the structure thereof, as the structural unit (a3), a structural unit represented by general formula (a3-3), (a3-4) or (a3-5) shown below is preferable.

[Chemical Formula 38]

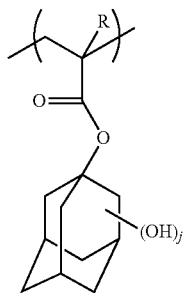 (a3-3)

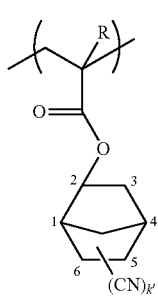 (a3-4)

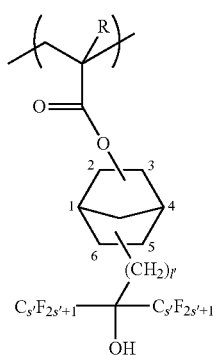 (a3-5)

In the formulas, R is the same as defined above; j is an integer of 1 to 3; k' is an integer of 1 to 3; t' is an integer of 1 to 3; l' is an integer of 1 to 5; and s' is an integer of 1 to 3.

In general formula (a3-3), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

In general formula (a3-4), k' is preferably 1. The cyano group is preferably bonded to the 5th or 6th position of the norbornyl group.

In formula (a3-5), t' is preferably 1. l' is preferably 1. s' is preferably 1.

In general formula (a3-5), the oxygen atom (—O—) within the carbonyloxy group is preferably bonded to the 2nd or 3rd position of the norbornane ring. The fluorinated alkylalcohol group is preferably bonded to the 5th or 6th position of the norbornyl group.

As the structural unit (a3) contained in the component (A1), 1 type of structural unit may be used, or 2 or more types may be used.

As the structural unit (a3), a structural unit represented by any one of the aforementioned general formulas (a3-1) to (a3-5) is preferable, and a structural unit represented by the aforementioned formula (a3-3) is particularly desirable.

In the component (A1), the amount of the structural unit (a3) based on the combined total of all structural units constituting the component (A1) is preferably 1 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit derived from an acrylate ester containing an acid non-dissociable, aliphatic cyclic group. When the component (A1) includes the structural unit (a4), the solubility of the component (A1) in the resist solvent and the organic developing solution is enhanced, and defectivity and various lithography properties such as sensitivity, resolution and LWR are improved.

An "acid non-dissociable, aliphatic cyclic group" refers to an aliphatic cyclic group which is not dissociated by the action of the acid generated from the component (B) upon exposure, and remains in the structural unit.

The aliphatic cyclic group is not particularly limited as long as it is acid non-dissociable, and any of the multitude of conventional polycyclic groups used within the resin component of resist compositions for ArF excimer lasers or KrF excimer lasers (and particularly for ArF excimer lasers) can be used. The aliphatic cyclic group may be either saturated or unsaturated, preferably saturated. Specific examples include groups in which one hydrogen atom has been removed from the cycloalkanes (such as monocycloalkanes and polycycloalkanes) described above in the explanation of the aliphatic cyclic group for the structural unit (a1).

The aliphatic cyclic group may be either a monocyclic group or a polycyclic group. In terms of the aforementioned effects, a polycyclic group is preferable. In particular, a bi-, tri- or tetracyclic group is preferable. In consideration of industrial availability and the like, at least one polycyclic group selected from amongst a tricyclodecyl group, an adamantyl group, a tetracyclododecyl group, an isobornyl group and a norbornyl group is particularly desirable.

Specific examples of the acid non-dissociable aliphatic cyclic group include monovalent aliphatic cyclic groups in which the carbon atom having an atom adjacent to the aliphatic cyclic group (e.g., —O— within —C(=O)—O—) bonded thereto has no substituent (a group or an atom other than hydrogen). More specific examples include groups represented by general formulas (1-1) to (1-9) explained above in relation to the structural unit (a1) in which the $R^{14}$ group has been substituted with a hydrogen atom; and a cycloalkane having a tertiary carbon atom constituting the ring skeleton and having one hydrogen atom removed from.

The aliphatic cyclic group may have a substituent. Examples of the substituent include an alkyl group of 1 to 5 carbon atoms, a fluorine atom and a fluorinated alkyl group.

As the structural unit (a4), a structural unit represented by general formula (a4-0) shown below is preferable, and a structural unit represented by any one of general formulas (a4-1) to (a4-5) shown below is particularly desirable.

[Chemical Formula 39]

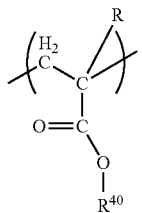
(a4-0)

In the formula, R is the same as defined above; and $R^{40}$ represents an acid non-dissociable, aliphatic polycyclic group.

[Chemical Formula 40]

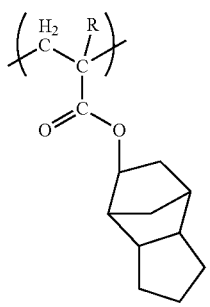
(a4-1)

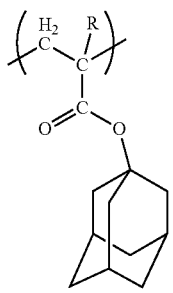
(a4-2)

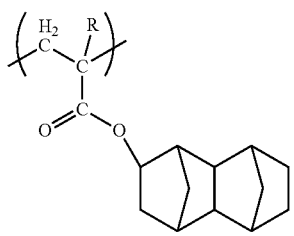
(a4-3)

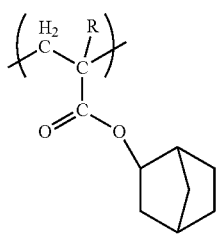
(a4-4)

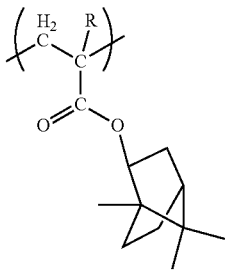
(a4-5)

In the formulas, R is the same as defined above.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 5 to 20 mol %.

The component (A1) may also have a structural unit other than the above-mentioned structural units (a0) to (a4), as long as the effects of the present invention are not impaired.

As such a structural unit, any other structural unit which cannot be classified as one of the above structural units (a0) to (a4) can be used without any particular limitation, and any of the multitude of conventional structural units used within resist resins for ArF excimer lasers or KrF excimer lasers (and particularly for ArF excimer lasers) can be used.

The component (A1) is preferably a copolymer containing the structural units (a1) and (a0), and more preferably a copolymer containing the structural units (a1), (a0) and (a3).

Specific examples of the component (A1) include a copolymer consisting of the structural units (a0) and (a1); a copolymer consisting of the structural units (a0), (a1) and (a2); a copolymer consisting of the structural units (a0), (a1) and (a3); a copolymer consisting of the structural units (a0), (a1), (a2) and (a3); a copolymer consisting of the structural units (a0), (a1), (a2) and (a4); a copolymer consisting of the structural units (a0), (a1), (a3) and (a4); and a copolymer consisting of the structural units (a0), (a1), (a2), (a3) and (a4).

The weight average molecular weight (Mw) (the polystyrene equivalent value determined by gel permeation chromatography (GPC)) of the component (A1) is not particularly limited, but is preferably 1,000 to 50,000, more preferably 1,500 to 30,000, and still more preferably 2,000 to 20,000. By ensuring the upper limit, the resist composition exhibits a satisfactory solubility in a resist solvent and an organic developing solution. On the other hand, by ensuring the lower limit, the dry etching resistance and the cross-sectional shape of the resist pattern becomes excellent.

Further, the dispersity (Mw/Mn) of the component (A1) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as dimethyl-2,2-azobis (2-methylpropionate) or azobisisobutyronitrile.

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing defects and LER (line edge roughness: unevenness of the side walls of a line pattern).

As the monomers which yield the corresponding structural units, commercially available monomers may be used, or the monomers may be synthesized by a conventional method.

In the component (A), as the component (A1), one type may be used, or two or more types of compounds may be used in combination.

In the component (A), the amount of the component (A1) based on the total weight of the component (A) is preferably 50% by weight or more, more preferably 80% by weight or more, and may even be 100% by weight.

In the resist composition of the present invention, the component (A) may contain "a base component which exhibits decreased solubility in an organic developing solution under action of acid" other than the component (A1) (hereafter, referred to as "component (A2)").

The component (A2) is not particularly limited, and any of the multitude of conventional base components used within chemically amplified resist compositions for use in positive tone development process with an alkali developing solution (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally at least one of the aforementioned structural units (a2) to (a4) can be used. Further, the component (A2) may contain a non-polymer (low molecular weight compound) having a molecular weight of 500 to less than 4,000.

As the component (A2), one type of resin may be used, or two or more types of resins may be used in combination.

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 41]

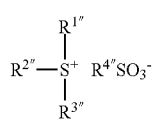

(b-1)

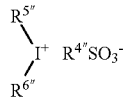

(b-2)

In the formulas above, $R^{1\prime\prime}$ to $R^{3\prime\prime}$, $R^{5\prime\prime}$ and $R^{6\prime\prime}$ each independently represent an aryl group or alkyl group which may have a substituent, wherein two of $R^{1\prime\prime}$ to $R^{3\prime\prime}$ may be bonded to each other to form a ring with the sulfur atom; and $R^{4\prime\prime}$ represents an alkyl group, a halogenated alkyl group, an aryl group or an alkenyl group which may have a substituent, with the provision that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group which may have a substituent or an alkyl group which may have a substituent. In formula (b-1), two of $R^{1\prime\prime}$ to $R^{3\prime\prime}$ may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group of $R^{1\prime\prime}$ to $R^{3\prime\prime}$ is not particularly limited, and includes, for example, an aryl group of 6 to 20 carbon atoms. The aryl group is preferably an aryl group having 6 to 10 carbon atoms because it can be synthesized at a low cost. Specific examples thereof include a phenyl group and a naphthyl group.

The aryl group may have a substituent. The expression "has a substituent" means that part or all of the hydrogen atoms within the aryl group has been substituted with a substituent. Examples of the substituent include an alkyl group, an alkoxy group, a halogen atom, a hydroxyl group, an alkoxyalkyloxy group, —O—$R^{50}$—C(=O)—(O)$_n$—$R^{51}$ (in the formula, $R^{50}$ represents an alkylene group or a single bond, $R^{51}$ represents an acid dissociable group or an acid non-dissociable group, and n represents 0 or 1.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group which substitutes the hydrogen atoms within the aryl group include —O—C($R^{47}$)($R^{48}$)—O—$R^{49}$ (in the formula, each of $R^{47}$ and $R^{48}$ independently represents a hydrogen atom or a linear or branched alkyl group, and $R^{49}$ represents an alkyl group, wherein $R^{48}$ and $R^{49}$ may be mutually bonded to form a ring structure, provided that at least one of $R^{47}$ and $R^{48}$ represents a hydrogen atom.

The alkyl group for $R^{47}$ and $R^{48}$ preferably has 1 to 5 carbon atoms. As the alkyl group, an ethyl group or a methyl group is preferable, and a methyl group is most preferable.

Further, it is preferable that at least one of $R^{47}$ and $R^{48}$ represent a hydrogen atom, and the other represent a hydrogen atom or a methyl group. It is particularly desirable that both of $R^{47}$ and $R^{48}$ represent a hydrogen atom.

The alkyl group for $R^{49}$ preferably has 1 to 15 carbon atoms, and may be linear, branched, or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10.

Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

$R^{48}$ and $R^{49}$ may be mutually bonded to form a ring structure. In such a case, a cyclic group is formed by $R^{48}$, $R^{49}$, the oxygen atom having $R^{49}$ bonded thereto, and the carbon atom having the oxygen atom and $R^{48}$ bonded thereto. Such a cyclic group is preferably a 4- to 7-membered ring, and more preferably a 4- to 6-membered ring.

In the —O—$R^{50}$—C(=O)—(O)$_n$—$R^{51}$ group which may substitute the hydrogen atoms within the aryl group, the alkylene group for $R^{50}$ is preferably a linear or branched alkylene group of 1 to 5 carbon atoms. Examples of the alkylene group include a methylene group, an ethylene group, a trimethylene group, a tetramethylene group and a 1,1-dimethylethylene group.

The acid dissociable group for $R^{51}$ is not particularly limited as long as it is an organic group that is dissociable by the action of an acid (generated from the component (B) upon exposure), and examples thereof include the same acid dissociable groups as those described above in the explanation of the structural unit (a1). Among these, a tertiary alkyl ester-type acid dissociable group is preferable.

Examples of the acid non-dissociable group for $R^{51}$ include a linear alkyl group which may have as substituent, a branched alkyl group (excluding tertiary alkyl groups) which may have a substituent, and acid non-dissociable, aliphatic cyclic group. Examples of the acid non-dissociable, aliphatic cyclic groups include the same groups as those described above for the structural unit (a4). Examples of preferable acid non-dissociable groups include a decyl group, a tricyclodecyl group, an adamantyl group, a 1-(1-adamantyl)methyl group, a tetracyclododecyl group, an isobornyl group and a norbornyl group.

The alkyl group for $R^{1\prime\prime\prime}$ to $R^{3\prime\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group may have a substituent. The expression "has a substituent" means that part or all of the hydrogen atoms within the alkyl group has been substituted with a substituent. Examples of the substituent include the same groups as those described above for the substituent of the aforementioned aryl group.

In formula (b-1), two of $R^{1\prime\prime\prime}$ to $R^{3\prime\prime\prime}$ may be mutually bonded to form a ring with the sulfur atom. The ring may be saturated or unsaturated.

Further, the ring may be monocyclic or polycyclic. For example, when either one or both of the two of $R^{1\prime\prime\prime}$ to $R^{3\prime\prime\prime}$ represent a cyclic group (a cyclic alkyl group or an aryl group), a polycyclic ring (condensed ring) is formed when the two groups are bonded.

When two of $R^{1\prime\prime\prime}$ to $R^{3\prime\prime\prime}$ are mutually bonded to form a ring, the ring containing the sulfur atom in the skeleton thereof is preferably a 3 to 10-membered ring, and most preferably a 5 to 7-membered ring.

Specific examples of the ring formed by two of $R^{1\prime\prime\prime}$ to $R^{3\prime\prime\prime}$ mutually bonded include benzothiophene, dibenzothiophene, 9H-thioxanthene, thioxanthene, thianthrene, phenoxathiine, tetrahydrothiophenium and tetrahydrothiopyranium.

When two of $R^{1\prime\prime\prime}$ to $R^{3\prime\prime\prime}$ are bonded to each other to form a ring with the sulfur atom, the remaining one of $R^{1\prime\prime\prime}$ to $R^{3\prime\prime\prime}$ is preferably an aryl group.

In the compound represented by formula (b-1), preferable examples of the cation moiety in which all of $R^{1\prime\prime\prime}$ to $R^{3\prime\prime\prime}$ represents a phenyl group which may have a substituent, i.e., the cation moiety having a triphenylsulfonium skeleton, include cation moieties represented by formulas (I-1-1) to (I-1-14) shown below.

[Chemical Formula 42]

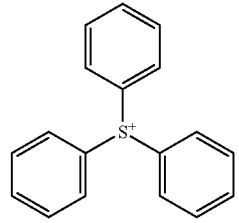
(I-1-1)

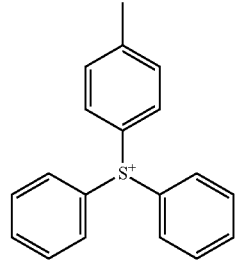
(I-1-2)

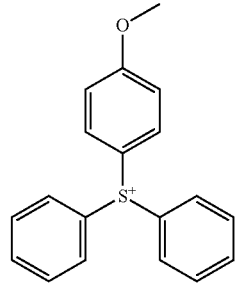
(I-1-3)

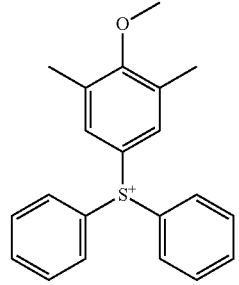
(I-1-4)

(I-1-5)
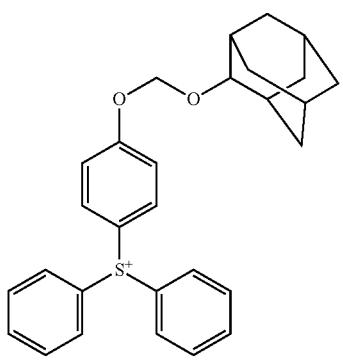
(I-1-6)
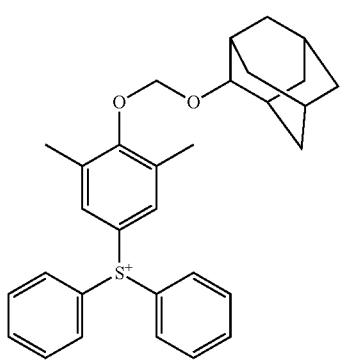
(I-1-7)
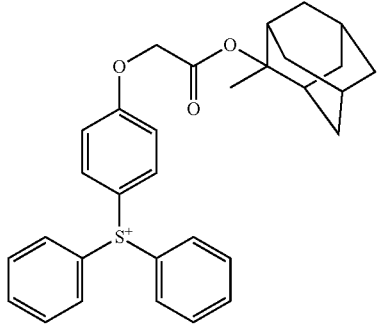
[Chemical Formula 43]
(I-1-8)
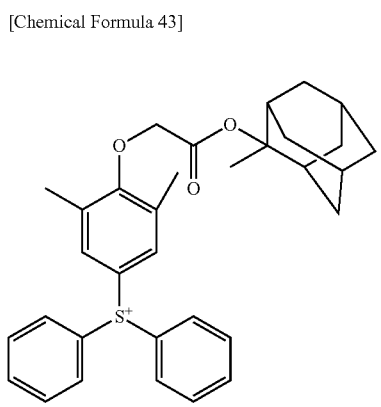
(I-1-9)
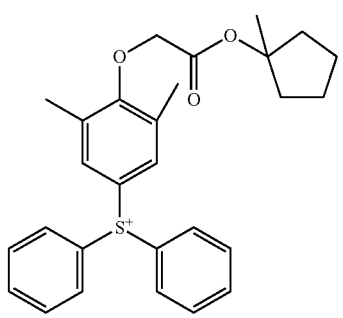
(I-1-10)
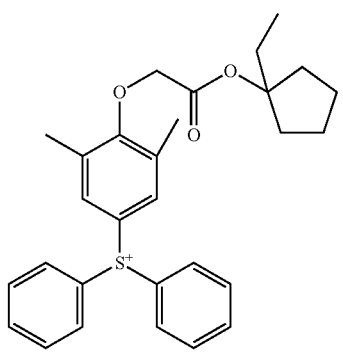
(I-1-11)
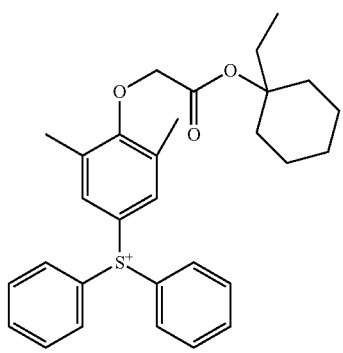
(I-1-12)
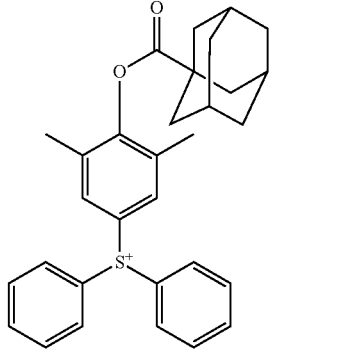

(I-1-13)

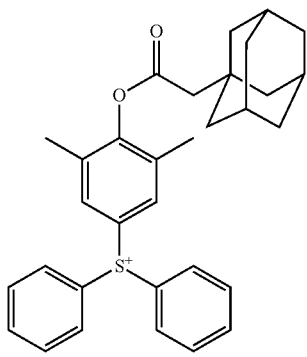

[Chemical Formula 45]

(I-11-12)

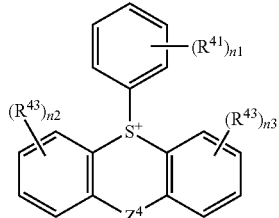

(I-11-13)

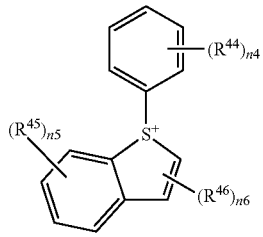

(I-1-14)

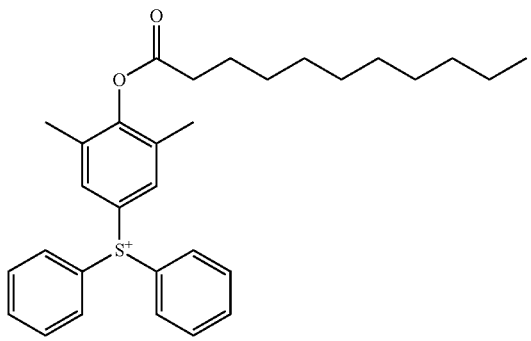

Further, a cation moiety in which part or all of the phenyl groups have been replaced with a naphthyl group which may have a substituent can also be given as a preferable example. It is preferable that 1 or 2 of the 3 phenyl groups are replaced with a naphthyl group.

Furthermore, in the compound represented by formula (b-1), preferable examples of the cation moiety in which two of $R^{1\prime\prime\prime}$ to $R^{3\prime\prime\prime}$ are mutually bonded to form a ring with the sulfur atom include cation moieties represented by formulas (I-11-10) to (I-11-13) shown below.

[Chemical Formula 44]

(I-11-10)

(I-11-11)

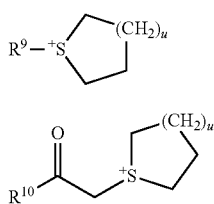

In the formulas, $R^9$ represents a phenyl group which may have a substituent, a naphthyl group which may have a substituent, or an alkyl group of 1 to 5 carbon atoms; $R^{10}$ represents a phenyl group which may have a substituent, a naphthyl group which may have a substituent, an alkyl group of 1 to 5 carbon atoms, an alkoxy group of 1 to 5 carbon atoms, or a hydroxy group; and u represents an integer of 1 to 3.

In the formulas, $Z^4$ represents a single bond, a methylene group, a sulfur atom, an oxygen atom, a nitrogen atom, a carbonyl group, —SO—, —SO$_2$—, —SO$_3$—, —COO—, —CONH— or —N(R$_N$)— (R$_N$ represents an alkyl group of 1 to 5 carbon atoms); each of $R^{41}$ to $R^{46}$ independently represents an alkyl group, an acetyl group, an alkoxy group, a carboxy group, a hydroxy group pr a hydroxyalkyl group; each of $n_1$ to $n_5$ independently represents an integer of 0 to 3; and $n_6$ represents an integer of 0 to 2.

In formulas (I-11-10) and (I-11-11), examples of the substituent for the phenyl group or the naphthyl group represented by $R^9$ and $R^{10}$ include the same substituents as those described above for the aryl group represented by $R^{1\prime\prime\prime}$ to $R^{3\prime\prime\prime}$. Further, examples of the substituent for the alkyl group represented by $R^9$ and $R^{10}$ include the same substituents as those described above for the alkyl group represented by $R^{1\prime\prime\prime}$ to $R^{3\prime\prime\prime}$.

u is an integer of 1 to 3, and most preferably 1 or 2.

In general formulas (I-11-12) and (I-11-13), with respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or ethoxy group.

The hydroxyallyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

In formulas (b-1) and (b-2), $R^{4"}$ represents an alkyl group, a halogenated alkyl group, an aryl group or an alkenyl group which may have a substituent.

The alkyl group for $R^{4"}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4"}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4"}$ is preferably an aryl group of 6 to 20 carbon atoms.

The alkenyl group for $R^{4"}$ is preferably an alkenyl group of 2 to 10 carbon atoms.

With respect to $R^{4"}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4"}$ may have one substituent, or two or more substituents.

Examples of the substituent include a halogen atom, a hetero atom, an alkyl group, and a group represented by the formula $X-Q^1-$ (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4"}$ include the same halogen atoms and alkyl groups as those described above with respect to the halogenated alkyl group for $R^{4"}$.

Examples of hetero atoms include an oxygen atom, a nitrogen atom, and a sulfur atom.

In the group represented by formula $X-Q^1-$, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

$Q^1$ is preferably a divalent linking group containing an ester linkage or ether linkage, and more preferably a group of —$R^{91}$—O—, —$R^{92}$—O—C(=O)—, —C(=O)—O—$R^{93}$—, or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The "substituent group containing a hetero atom" (hereafter, referred to as "hetero atom-containing substituent") may consist of a hetero atom, or may be a group containing a group or atom other than a hetero atom.

Specific examples of the hetero atom-containing substituent for substituting part of the carbon atoms constituting the aliphatic hydrocarbon group include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the hetero atom-containing substituent is —NH—, the substituent for substituting H (an alkyl group, an acyl group or the like) preferably has 1 to 10 carbon atoms, more preferably 1 to 8 carbon atoms, and most preferably 1 to 5 carbon atoms.

When the aliphatic hydrocarbon group is cyclic, the aliphatic hydrocarbon group may contain any of these substituent groups in the ring structure.

Examples of the hetero atom-containing substituent for substituting part or all of the hydrogen atoms constituting the aliphatic hydrocarbon group include a halogen atom, an alkoxy group, a hydroxy group, —C(=O)—R$^{80}$ [R$^{80}$ represents an alkyl group], —COOR$^{81'}$ [R$^{81'}$ represents a hydrogen atom or an alkyl group], a halogenated alkyl group, a halogenated alkoxy group, an amino group, an amido group, a nitro group, an oxygen atom (=O), a sulfur atom and a sulfonyl group (SO$_2$).

Examples of the halogen atom for the hetero atom-containing substituent include a fluorine atom, a chlorine atom, a bromine atom and an iodine atom, and a fluorine atom is preferable.

The alkyl group within the alkoxy group for the hetero atom-containing substituent may be linear, branched, cyclic, or a combination thereof. The number of carbon atoms thereof is preferably 1 to 30. When the alkyl group is linear or branched, the number of carbon atoms thereof is preferably 1 to 20, more preferably 1 to 17, still more preferably 1 to 15, and most preferably 1 to 10. Specific examples include the same alkyl groups as those described later as examples of linear or branched, saturated hydrocarbon group. When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantine, norbornane, isobornane, tricyclodecane and tetracyclododecane. These cycloalkyl groups may or may not have part or all of the hydrogen atoms bonded to the ring substituted with a substituent such as a fluorine atom or a fluorinated alkyl group.

In the —C(=O)—R$^{80}$ group and the —COOR$^{81'}$ group for the hetero atom-containing substituent, examples of the alkyl group for R$^{80}$ and R$^{81'}$ include the same alkyl groups as those described above for the alkyl group within the aforementioned alkoxy group.

Examples of the alkyl group within the halogenated alkyl group for the hetero atom-containing substituent include the same alkyl groups as those described above for the alkyl group within the aforementioned alkoxy group. As the halogenated alkyl group, a fluorinated alkyl group is particularly desirable.

Examples of the halogenated alkoxy group for the hetero atom-containing substituent include the aforementioned alkoxy groups in which part or all of the hydrogen atoms have been substituted with the aforementioned halogen atoms. As the halogenated alkoxy group, a fluorinated alkoxy group is preferable.

Examples of the hydroxyallyl group for the hetero atom-containing substituent include the alkyl groups given as examples of the alkyl group within the aforementioned alkoxy group in which at least one hydrogen atom has been substituted with a hydroxy group. The number of hydroxy groups within the hydroxyalkyl group is preferably 1 to 3, and most preferably 1.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butyryl group. Examples of branched monovalent unsaturated hydrocarbon groups include a 1-methylpropenyl group and a 2-methylpropenyl group. As the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 46]

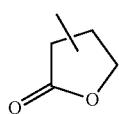
(L1)

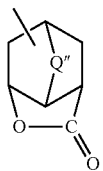
(L2)

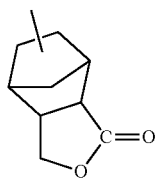
(L3)

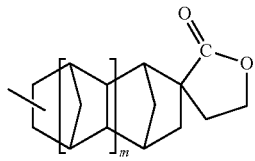
(L4)

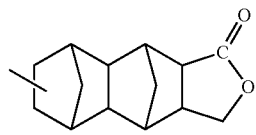
(L5)

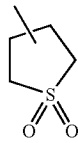
(S1)

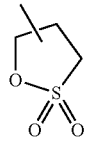
(S2)

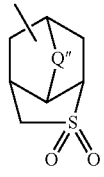
(S3)

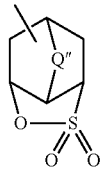
(S4)

In the formulas, Q" represents an oxygen atom, a sulfur atom or an alkylene group which may contain an oxygen atom or a sulfur atom; and m represents 0 or 1.

In the formulas, the alkylene group for Q" is preferably linear or branched, and preferably has 1 to 5 carbon atoms. Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—]. Among these, a methylene group or an alkylmethylene group is preferable, and a methylene group, —CH(CH$_3$)— or —C(CH$_3$)$_2$— is particularly desirable.

The alkylene group may contain an oxygen atom (—O—) or a sulfur atom (—S—). As an example of such a group, the aforementioned alkylene group having —O— or —S— on the terminal or interposed between the carbon atoms can be mentioned. Specific examples thereof include —O—R$^{94}$—, —S—R$^{95}$—, —R$^{96}$—O—R$^{97}$— and —R$^{98}$—S—R$^{99}$—. Herein, each of R$^{94}$ to R$^{99}$ independently represents an alkylene group. Examples of the alkylene group include the same alkylene groups as those described above for Q". Among these, —O—CH$_2$—, —CH$_2$—O—CH$_2$—, —S—CH$_2$— and —CH$_2$—S—CH$_2$— are preferable.

These aliphatic cyclic groups may have part or all of the hydrogen atoms substituted with a substituent. Examples of the substituent include an alkyl group, a halogen atom, an alkoxy group, a hydroxy group, —C(=O)—R$^{80}$ [R$^{80}$ represents an alkyl group], —COOR$^{81}$ [R$^{81}$ represents a hydrogen atom or an alkyl group], a halogenated alkyl group, a halogenated alkoxy group, an amino group, an amido group, a nitro group, an oxygen atom (=O), a sulfur atom and a sulfonyl group (SO$_2$).

Examples of the alkyl group for the substituent include the same alkyl groups as those described above for the alkyl group within the alkoxy group for the aforementioned hetero atom-containing substituent.

As the alkyl group, an alkyl group of 1 to 6 carbon atoms is particularly desirable. The alkyl group is preferably linear or branched, and specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the halogen atom, the alkoxy group, the —C(=O)—R$^{80}$ group, the —COOR$^{81}$ group, the halogenated alkyl group and the halogenated alkoxy group for the substituent, the same groups as those described above as examples of the hetero atom-containing substituent for substituting part or all of the hydrogen atoms constituting the aforementioned aliphatic hydrocarbon group can be mentioned.

Among these examples, as the substituent for substituting the hydrogen atom of the aforementioned aliphatic cyclic group, an alkyl group, an oxygen atom (=O) or a hydroxy group is preferable.

The aliphatic cyclic group may have 1 substituent, or 2 or more substituents. When the aliphatic cyclic group has a plurality of substituents, the substituents may be the same or different from each other.

As X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

When the R$^{4'''}$ group has X-Q$^1$- as a substituent, R$^{4'''}$ is preferably a group represented by the formula X-Q$^1$-Y$^1$— (in the formula, Q$^1$ and X are the same as defined above, and Y$^1$ represents an alkylene group of 1 to 4 carbon atoms which may have a substituent or a fluorinated alkylene group of 1 to 4 carbon atoms which may have s substituent.

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of Y' include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5'''}$ and R$^{6'''}$ each independently represent an aryl group or alkyl group. At least one of R$^{5'''}$ and R$^{6'''}$ represents an aryl group. It is preferable that both of R$^{5'''}$ and R$^{6'''}$ represent an aryl group.

As the aryl group for R$^{5'''}$ and R$^{6'''}$, the same as the aryl groups for R$^{1'''}$ to R$^{3'''}$ can be used.

As the alkyl group for R$^{5'''}$ and R$^{6'''}$, the same as the alkyl groups for R$^{1'''}$ to R$^{3'''}$ can be used.

It is particularly desirable that both of R$^{5'''}$ and R$^{6'''}$ represents a phenyl group.

As R$^{4'''}$ in formula (b-2), the same groups as those mentioned above for R$^{4'''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate which may have a substituent, such as methanesulfonate, n-propanesulfonate, n-butanesulfonate, n-octanesulfonate, 1-adamantanesulfonate, 2-norbornanesulfonate or d-camphor-10-sulfonate; or replaced by an aromatic sulfonate, such as benzenesulfonate, perfluorobenzenesulfonate or p-toluenesulfonate.

Furthermore, onium salts in which the anion moiety of these onium salts are replaced by an anion moiety represented by any one of formulas (b1) to (b8) shown below can be used.

[Chemical Formual 47]

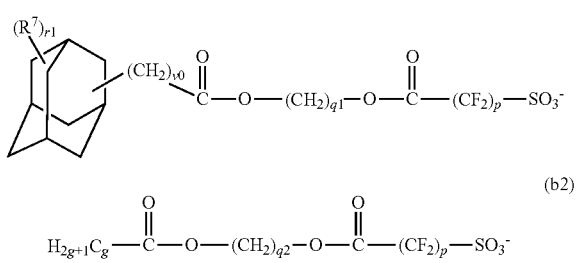

(b1)

(b2)

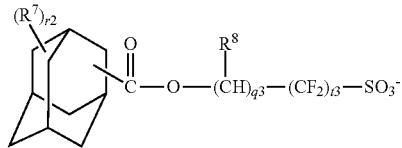

(b3)

In the formulas, p represents an integer of 1 to 3; v0 represents an integer of 0 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; $R^7$ represents a substituent; and $R^8$ represents a hydrogen atom, an alkyl group of 1 to 5 carbon atoms or a halogenated alkyl group of 1 to 5 carbon atoms.

[Chemical Formula 48]

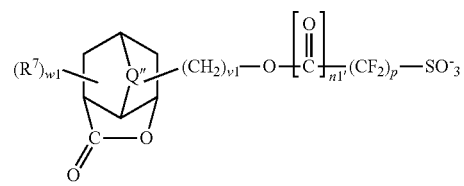

(b4)

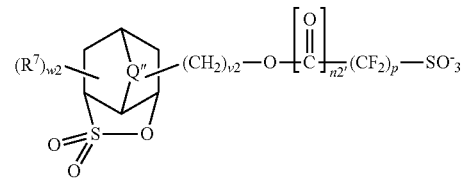

(b5)

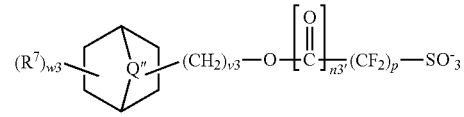

(b6)

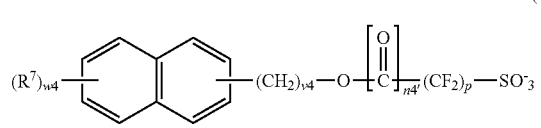

(b7)

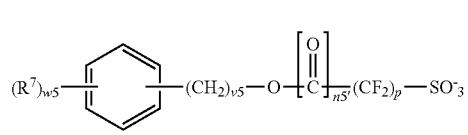

(b8)

In the formulas, p, $R^7$ and Q″ are the same as defined above; each of n1′ to n5′ independently represents 0 or 1; each of v1 to v5 independently represents an integer of 0 to 3; and each of w1 to w5 independently represents an integer of 0 to 3.

Examples of the substituent represented by $R^7$ include an alkyl group and a hetero atom-containing substituent. Examples of the alkyl group include the same alkyl groups as those described above as the substituent for the aromatic hydrocarbon group in the explanation of X. Examples of the hetero atom-containing substituent include the same hetero atom-containing substituents as those described above for substituting part or all of the hydrogen atoms constituting the aforementioned aliphatic hydrocarbon group.

If there are two or more of the $R^7$ group, as indicated by the values r1, r2, and w1 to w5, then the two or more of the $R^7$ groups may be the same or different from each other.

The alkyl group and the halogenated alkyl group for $R^8$ are respectively the same as defined for the alkyl group and the halogenated alkyl group for R.

Each of r1, r2, and w1 to w5 is preferably an integer of 0 to 2, and more preferably 0 or 1.

v0 to v5 is preferably 0 to 2, and most preferably 0 or 1.

t3 is preferably 1 or 2, and most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 49]

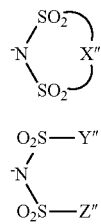

(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, it is possible to use an onium salt-based acid generator represented by general formula (b-1) or (b2) in which the anion moiety ($R^{4"}SO_3^-$) has been replaced by $R^{7"}$—COO$^-$ (in the formula, $R^{7"}$ represents an alkyl group or a fluorinated alkyl group) (the cation moiety is the same as (b-1) or (b-2)).

As $R^{7"}$, the same groups as those described above for $R^{4"}$ can be used.

Specific examples of the group represented by the formula "$R^{7"}$—COO$^-$" include a trifluoroacetate ion, an acetate ion, and a 1-adamantanecarboxylic acid ion.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 50]

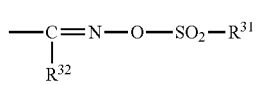

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 51]

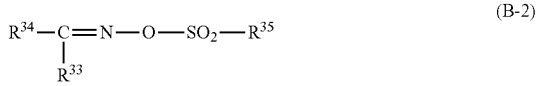

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 52]

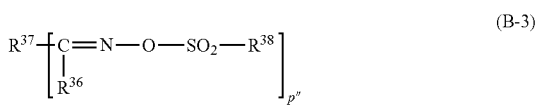

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include
α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide,
α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thien-2-yl acetonitrile,
α-(4-dodecylbenzenesulfonyloxyimino)benzyl cyanide,
α-[(p-toluenesulfonyloxyimino)-4-methoxyphenyl]acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)-cyclohexyl acetonitrile,
α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile,
α-(cyclohexylsulfonyloxyimino)-cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile,
α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile,
α-(n-butylsulfonyloxyimino)-1-cyclohexenyl acetonitrile,
α-(methylsulfonyloxyimino)-phenyl acetonitrile,
α-(methylsulfonyloxyimino)-p-methoxyphenyl acetonitrile,
α-(trifluoromethylsulfonyloxyimino)-phenyl acetonitrile,
α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 53]

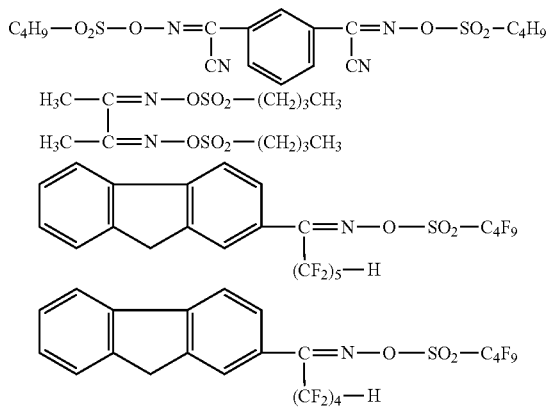

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the resist composition, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

The resist composition of the present invention may contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used.

In general, a low molecular weight compound (non-polymer) is used as the component (D). Examples of the component (D) include an aliphatic amine and an aromatic amine. Among these, an aliphatic amine is preferable, and a secondary aliphatic amine or tertiary aliphatic amine is particularly desirable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Examples of aromatic amines include aniline, N,N-dibutylaniline, pyridine, 4-dimethylaminopyridine, pyrrole, indole, pyrazole, imidazole and derivatives thereof, as well as diphenylamine, triphenylamine, tribenzylamine, 2,6-diisopropylaniline, 2,2'-dipyridyl and 4,4'-dipyridyl.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group.

Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone, cyclohexanone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

According to the negative tone-development resist composition described above, a fine pattern can be formed by a negative tone development process using a developing solution containing an organic solvent, and excellent lithography properties such as sensitivity and exposure margin (EL margin) during the formation of a resist pattern can be achieved. Further, a resist pattern with an excellent shape and reduced roughness such as line width roughness (LWR) can be formed. EL margin is the range of the exposure dose in which a resist pattern can be formed with a size within a predetermined range of variation from a target size, when exposure is conducted by changing the exposure dose, i.e., the range of the exposure dose in which a resist pattern faithful to the mask pattern can be formed. The larger the EL margin, the smaller the variation in the pattern size depending on the change in the exposure dose, thereby resulting in favorable improvement in the process margin. LWR refers to the phenomenon in which the line widths of a line pattern formed using a resist composition becomes heterogeneous, and improvement in this characteristic becomes more important as the pattern becomes finer.

The reason why these effects can be achieved has not been elucidated yet, but the following is presumed. In the component (A), the —SO$_2$— containing cyclic group exhibits a high polarity. Therefore, as compared to a resin component in which the —SO$_2$— containing cyclic group has been replaced by, for example, a lactone structure, despite that the resin exhibits a poor solubility in an organic solvent, the polarity is significantly increased by a small amount of decomposition of the acid decomposable group. As a result, the solubility of the resin component in an organic solvent is significantly decreased, and hence, a good contrast can be achieved between the exposed portions and the unexposed portions. Further, by virtue of the component (A1) having an —SO$_2$— containing cyclic group which is a polar group, it is presumed that the adhesion to a substrate of a resist film formed using the resist composition is improved, and the uniformity of the distribution of the component (B) within the resist film is improved. In addition, by virtue of an interaction between the —SO$_2$— containing cyclic group and the component (B), it is presumed that diffusion of acid upon exposure can be suppressed, so that the diffusion length of the acid becomes short.

EXAMPLES

As follows is a description of examples of the present invention, although the scope of the present invention is by no way limited by these examples.

In the following examples, a unit represented by a chemical formula (m0-1) is referred to as "compound (m0-1)", and the same applies for compounds represented by other formulas.

The monomers used in the following polymer synthesis examples (compounds (m0-1), (m0-2), (m2-1), (m2-2), (m1-1) to (m1-5) and (m3-1)) are shown below.

Among these, the compound (m0-1) was synthesized in Monomer Synthesis Example 1 described below.

In the NMR analysis, the internal standard for $^1$H-NMR and $^{13}$C-NMR was tetramethylsilane. The internal standard for $^{19}$F-NMR was hexafluorobenzene (provided that the peak of hexafluorobenzene was regarded as −160 ppm).

[Chemical Formula 54]

(m0-1)

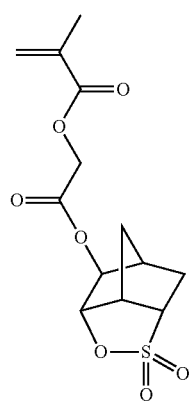

(m0-2)

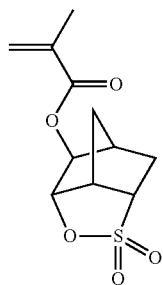

(m2-1)

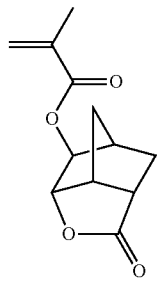

(m2-2)

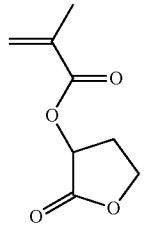

(m3-1)

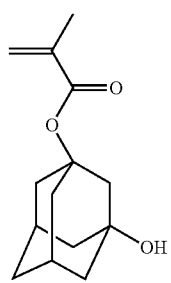

(m1-1)

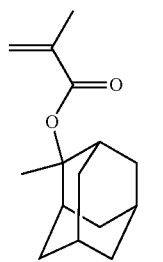

(m1-2)

(m1-3)

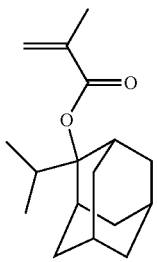

(m1-4)

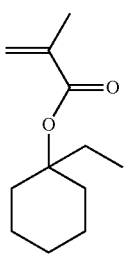

(m1-5)

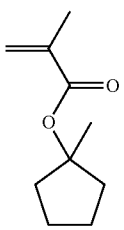

Monomer Synthesis Example 1

300 ml of a THF solution containing 20 g (105.14 mmol) of an alcohol (1) shown below, 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) shown below was added thereto while cooling with ice (0° C.), followed by stirring at room temperature for 12 hours.

After conducting thin-layer chromatography (TLC) to confirm that the raw materials had dissipated, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and aqueous solution of 1N-HCl in this order. Thereafter, the solvent was distilled off under reduced pressure, and the resulting product was dried, thereby obtaining the objective compound (m0-1).

[Chemical Formula 55]

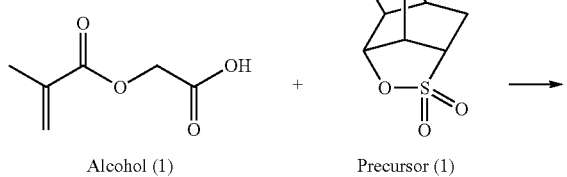

Alcohol (1)   Precursor (1)

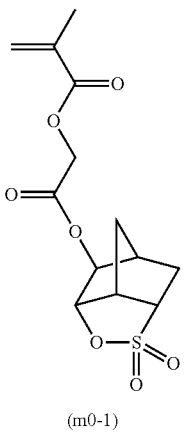

(m0-1)

Polymer Synthesis Example 1

In a separable flask equipped with a thermometer, a reflux tube and a nitrogen feeding pipe, 22.00 g (69.55 mmol) of a compound (m0-1), 33.57 g (143.26 mmol) of a compound (m1-1) and 11.26 g (47.67 mmol) of a compound (m3-1) were dissolved in 46.58 g of methyl ethyl ketone (MEK) to obtain a solution. Then, 26.05 mmol of dimethyl 2,2'-azobis(isobutyrate) (V-601) was added and dissolved in the obtained solution.

The resultant was dropwise added to 85.07 g of MEK heated to 80° C. in a nitrogen atmosphere over 3 hours. Thereafter, the reaction solution was heated for 2 hour while stirring, and then cooled to room temperature.

The obtained reaction polymer solution was dropwise added to an excess amount of an n-heptane/isopropyl alcohol mixed solvent to deposit a polymer. Thereafter, the precipitated white powder was separated by filtration, followed by washing with methanol and MEK, and then drying, thereby obtaining 51.1 g of a polymeric compound 1 as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 6,900, and the dispersity was 1.71.

Further, the polymeric compound was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=29.9/49.7/20.4.

[Chemical Formula 56]

Polymeric compound 1

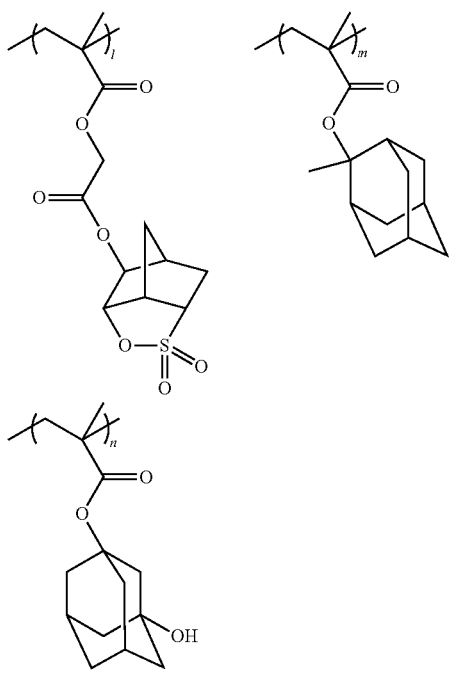

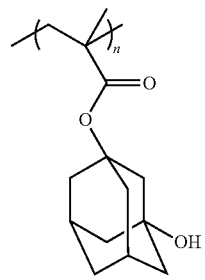

Polymer Synthesis Example 2

The same procedure as in Polymer Synthesis Example 1 was performed, except that the aforementioned compounds (m0-1), (m1-2) and (m3-1) were used in predetermined molar ratio, thereby obtaining a polymeric compound 2 as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 5,600, and the dispersity was 1.56.

Further, the polymeric compound 5 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=24.7/51.4/23.9.

[Chemical Formula 57]

Polymeric compound 2

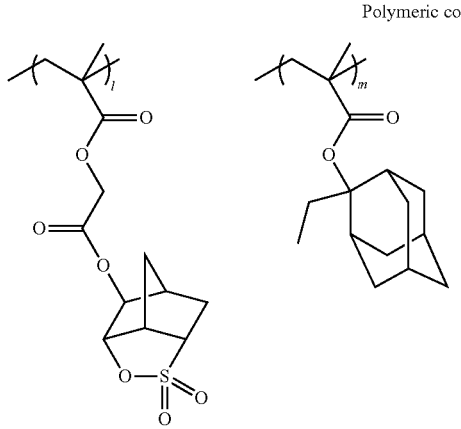

Polymer Synthesis Example 3

The same procedure as in Polymer Synthesis Example 1 was performed, except that the aforementioned compounds (m0-1), (m1-3), (m1-4) and (m3-1) were used in predetermined molar ratio, thereby obtaining a polymeric compound 3 as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 9,700, and the dispersity was 1.73.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o=26.5/14.3/41.1/18.1.

[Chemical Formula 58]

Polymeric compound 3

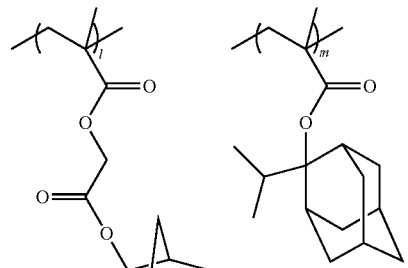

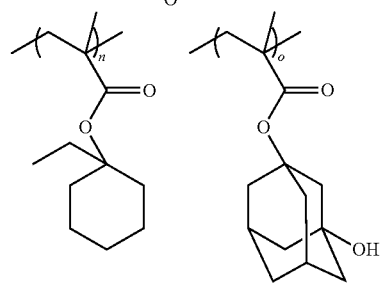

Polymer Synthesis Example 4

The same procedure as in Polymer Synthesis Example 1 was performed, except that the aforementioned compounds (m0-2) and (m1-4) were used in predetermined molar ratio, thereby obtaining a polymeric compound 4 as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 5,600, and the dispersity was 1.60.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m=44.2/55.8.

[Chemical Formula 59]

Polymeric compound 4

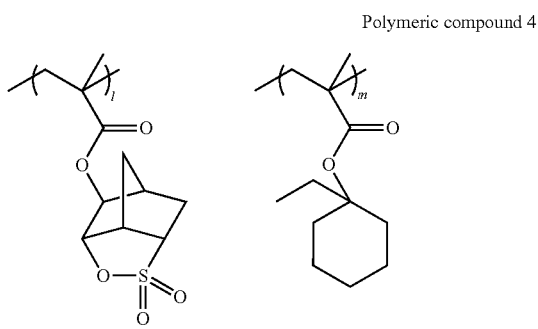

Comparative Polymer Synthesis Example 1

The same procedure as in Polymer Synthesis Example 1 was performed, except that the aforementioned compounds (m2-1), (m1-1) and (m3-1) were used in predetermined molar ratio, thereby obtaining a polymeric compound 1' as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 6,400, and the dispersity was 1.79.

Further, the polymeric compound 5 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=37.7/41.8/20.5.

[Chemical Formula 60]

Polymeric compound 1'

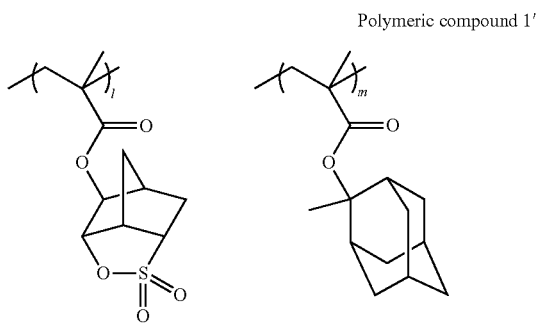

-continued

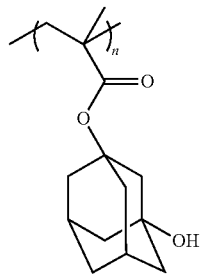

Comparative Polymer Synthesis Example 2

The same procedure as in Polymer Synthesis Example 1 was performed, except that the aforementioned compounds (m2-2), (m1-2) and (m3-1) were used in predetermined molar ratio, thereby obtaining a polymeric compound 2' as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 5,300, and the dispersity was 1.55.

Further, the polymeric compound 5 was analyzed by carbon 13 nuclear magnetic resonance spectroscopy (600 MHz, $^{13}$C-NMR). As a result, it was found that the composition of the copolymer (ratio (molar ratio) of the respective structural units within the structural formula) was l/m/n=30.4/48.9/20.7.

[Chemical Formula 61]

Polymeric compound 2'

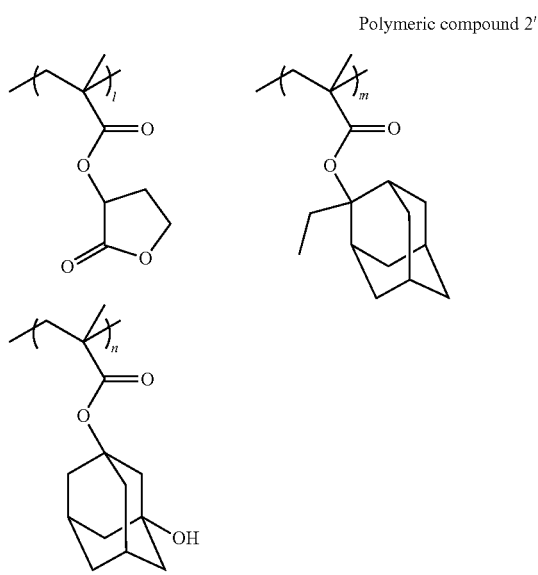

Comparative Polymer Synthesis Example 3

The same procedure as in Polymer Synthesis Example 1 was performed, except that the aforementioned compounds (m2-2), (m1-3), (m1-4) and (m3-1) were used in predetermined molar ratio, thereby obtaining a polymeric compound 3' as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 6,600, and the dispersity was 1.42.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o=23.3/16.0/38.9/21.8.

[Chemical Formula 62]

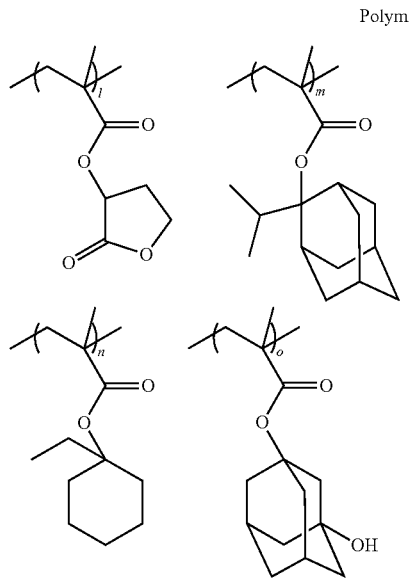

Polymeric compound 3'

Comparative Polymer Synthesis Example 4

The same procedure as in Comparative Polymer Synthesis Example 1 was performed, except that the compound (m2-2) was used instead of the compound (m2-1), thereby obtaining a polymeric compound 4' as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.58.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o=30.5/48.7/20.8.

Test Example 1

Solubility in Organic Solvent

Among the monomers used in Polymer Synthesis Examples 1 to 4 and Comparative Polymer Synthesis Examples 1 to 4, with respect to compounds (m0-1) and (m0-2) which are classified as a structural unit (a0), compounds (m2-1) and (m2-2) which are classified as a structural unit (a2), a compound in which the —S(=O)$_2$— portion of the compound (m0-1) has been replaced with —C(=O)— (a compound in which the cyclic group within the compound (m0-1) has been replaced with the cyclic group of the compound (m2-1), hereafter referred to as compound (m2-3)), and polymeric compounds 1, 1' and 4', the solubility in an organic solvent was evaluated as follows.

1 g of each compound was added to an organic solvent indicated in Table 1 at 25° C., and stirred for 1 hour. After the stirring, the degree of dissolution of each compound in each organic solvent was evaluated with the following criteria. The results are shown in Table 1.

(Criteria for Degree of Dissolution of Monomer)
A: 40% by weight or more
B: 15% by weight or more but less than 40% by weight
C: 7% by weight or more but less than 15% by weight
D: less than 7% by weight
(Criteria for Degree of Dissolution of Polymeric Compound)
A: 40% by weight or more
B: 15% by weight or more but less than 40% by weight
C: 5% by weight or more but less than 15% by weight
D: 1% by weight or more but less than 5% by weight
E: less than 1% by weight

TABLE 1

| Monomer | PGMEA | PGME | MEK | Butyl acetate |
|---|---|---|---|---|
| Compound (m0-1) | C | C | B | C |
| Compound (m0-2) | C | C | B | D |
| Compound (m2-1) | B | C | B | C |
| Compound (m2-2) | A | A | A | A |
| Compound (m2-3) | A | B | A | B |

| | Polymeric compound | | | | | | Butyl |
|---|---|---|---|---|---|---|---|
| | Compositional ratio | Mw | Mw/Mn | PGMEA | PGME | MEK | acetate |
| 1 | m0-1/m1-1/m3-1 = 29.9/49.7/20.4 | 6,900 | 1.71 | B | C | B | E |
| 1' | m2-1/m1-1/m3-1 = 37.1/41.8/20.5 | 6,400 | 1.79 | B | B | A | D |
| 4' | m2-2/m1-1/m3-1 = 30.5/48.7/20.8 | 7,000 | 1.58 | A | B | A | C |

As seen from the results, the monomer for deriving the structural unit (a0) exhibited poor solubility in an organic solvent, as compared to the monomer for deriving the structural unit (a2). For example, from a comparison between the compound (m0-1) and the compound (m2-3), despite that the compound (m0-1) has the same structure as the compound (m2-3) except that —C(═O)— within the cyclic group has been replace with —S(═O)$_2$—, the compound (m0-1) exhibited a significantly low solubility. Further, from a comparison between the compound (m0-2) and the compound (m2-1), despite that the compound (m0-2) had the same structure as the compound (m2-1) except that —C(═O)— within the cyclic group has been replaced with —S(═O)$_2$—, the compound (m0-2) exhibited a significantly low solubility.

In addition, with respect to the polymeric compounds, the polymeric compound 1 having an —SO$_2$— containing cyclic group exhibits a low solubility in an organic solvent as compared to the polymeric compounds 1' and 4' having a lactone-containing cyclic group, despite that the monomers other than the compound (m0-1) which has been replaced with the compound (m2-1) or (m2-2) were the same.

Examples 1 to 4, Comparative Examples 1 to 3

The components shown in Table 2 were mixed together and dissolved to obtain resist compositions.

TABLE 2

|  | Component (A) | Component (B) | Component (D) | Component (S) |
|---|---|---|---|---|
| Ex. 1 | (A)-1 | (B)-1 | (D)-1 | (S)-1 |
|  | [100] | [7.1] | [0.57] | [3000] |
| Comp. Ex 1 | (A)-1' | (B)-1 | (D)-1 | (S)-1 |
|  | [100] | [7.1] | [0.57] | [3000] |
| Ex. 2 | (A)-2 | (B)-1 | (D)-1 | (S)-1 |
|  | [100] | [7.1] | [0.57] | [3000] |
| Comp. Ex. 2 | (A)-2' | (B)-1 | (D)-1 | (S)-1 |
|  | [100] | [7.1] | [0.57] | [3000] |
| Ex. 3 | (A)-3 | (B)-1 | (D)-1 | (S)-1 |
|  | [100] | [7.1] | [0.57] | [3000] |
| Comp. Ex. 3 | (A)-3' | (B)-1 | (D)-1 | (S)-1 |
|  | [100] | [7.1] | [0.57] | [3000] |
| Ex. 4 | (A)-4 | (B)-1 | (D)-1 | (S)-1 |
|  | [100] | [7.1] | [0.57] | [3000] |

In Table 2, the values in brackets [ ] indicate the amount (in terms of parts by weight) of the component added, and the reference characters indicate the following.

(A)-1 to (A)-4: the aforementioned polymeric compounds 1 to 4

(A)-1' to (A)-3': the aforementioned polymeric compounds 1' to 3'

(B)-1: a compound represented by structural formula (B)-1 shown below (D)-1: N,N-dibutylaniline (S)-1: a mixed solvent of PGMEA/PGME=6/4 (weight ratio)

[Chemical Formula 63]

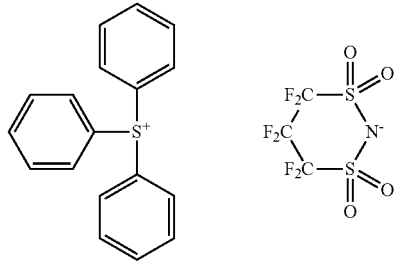

(B)-1

Using the obtained resist compositions, the following evaluations were conducted.

[Formation of Resist Pattern by Negative Tone Development]

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 82 nm. The aforementioned resist composition was then applied to the organic anti-reflection film using a spinner, and was then prebaked (PAB) and dried on a hotplate at 100° C. for 60 seconds, thus forming a resist film having a film thickness of 100 nm. Subsequently, the resist film was selectively irradiated with an ArF excimer laser (193 nm) through a mask pattern targeting a line and space resist pattern (hereafter, referred to as "LS pattern") having a line width of 200 nm and a pitch of 400 nm, using an ArF exposure apparatus NSR-S302 (manufactured by Nikon Corporation, NA (numerical aperture)=0.60, ⅔ annular illumination). Next, a post exposure bake (PEB) treatment was conducted at a temperature indicated in Table 3 for 60 seconds, followed by development for 30 seconds at 23° C. in butyl acetate. Then, the resist film was rinsed with 1-hexanol for 30 seconds, followed by drying by shaking.

As a result, in the examples using the resist compositions of Examples 1 to 4 and Comparative Example 2, the unexposed portions of the resist film was dissolved and removed, thereby forming an LS pattern having a line width of 200 nm and a pitch of 400

On the other hand, in the examples using the resist compositions of Comparative Examples 1 and 3, an LS pattern could not be resolved. The reason for this is presumed that the unexposed portions could not be completely dissolved within the predetermined developing time, or the exposed portions were dissolved as well as the unexposed portions.

[Evaluation of Sensitivity]

As the sensitivity, the optimum exposure dose Eop(mJ/cm$^2$) with which an LS pattern having a line width of 200 nm and a pitch of 400 nm was formed in the aforementioned [Formation of resist pattern] was determined. The results are shown in Table 3.

[Evaluation of Line Width Roughness (LWR)]

With respect to each of the LS patterns formed with the above Eop and having a line width of 200 nm and a pitch of 400 nm, the line width at 5 points in the lengthwise direction of the line were measured using a measuring scanning electron microscope (SEM) (product name: S-9220, manufactured by Hitachi, Ltd.), and from the results, the value of 3 times the standard deviation s (i.e., 3s) was calculated as a yardstick of LWR. The results are shown in Table 3. The smaller this 3s value is, the lower the level of roughness of the line width, indicating that a LS pattern with a uniform width was obtained.

TABLE 3

|  | Ex. 1 | Comp. Ex. 1 | Ex 2. | Comp. Ex. 2 | Ex. 3 | Comp. Ex. 3 | Ex. 4 |
| --- | --- | --- | --- | --- | --- | --- | --- |
| PEB(° C.) | 110 | 110 | 100 | 100 | 95 | 95 | 100 |
| Eop(mJ/cm²) | 17 | — | 12 | 14 | 12 | — | 9 |
| LWR(nm) | 20.5 | — | 18.9 | 19.6 | 19.3 | — | 13.8 |

As seen from the results, according to the resist compositions of Examples 1 to 4 containing the polymeric compounds 1 to 4 as the component (A), respectively, an LS pattern having a line width of 200 nm and a pitch of 400 nm could be formed with a high sensitivity by a negative tone development using butyl acetate as the developing solution, and the LWR of the LS patterns was low.

On the other hand, in Comparative Example 1 using the polymeric compound 1' in which the same monomers as the polymeric compound 1 were used except that the compound (m2-1) was used instead of the compound (m0-1), an LS pattern could not be formed. Likewise, in Comparative Example 3 using the polymeric compound 1' in which the same monomers as the polymeric compound 3 were used except that the compound (m2-2) was used instead of the compound (m0-1), an LS pattern could not be formed.

In Comparative Example 2 using the polymeric compound 2' in which the same monomers as the polymeric compound 2 were used except that the compound (m2-2) was used instead of the compound (m0-1), although an LS pattern could be formed, the sensitivity and the LWR were poor as compared to Example 2.

Polymer Synthesis Example 5

The same procedure as in Polymer Synthesis Example 1 was performed, except that the aforementioned compounds (m2-2), (m0-1), (m1-3), (m1-5) and (m3-1) were used in predetermined molar ratio, thereby obtaining a polymeric compound 5 as an objective compound.

With respect to the polymeric compound, the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.56.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was a2/a0/a11/a12/a3=35/22/18/13/12.

[Chemical Formula 64]

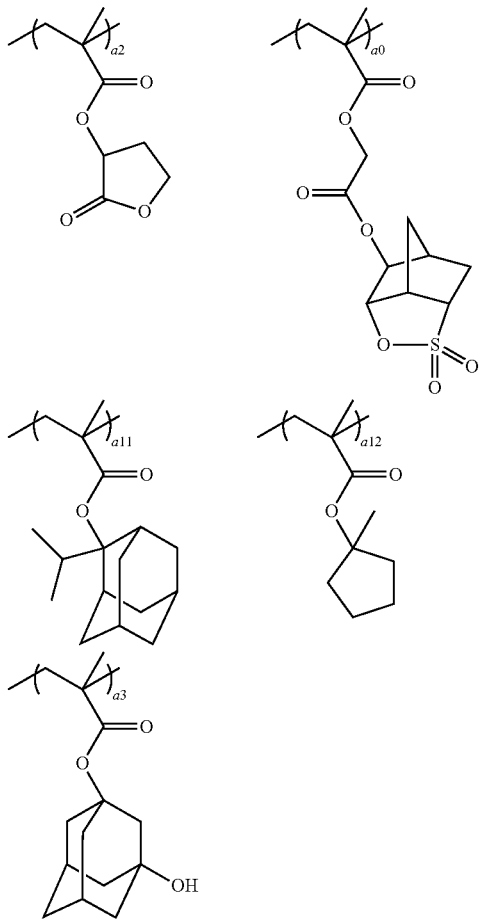

Polymeric compound 5

Example 5

The components shown in Table 4 were mixed together and dissolved to obtain a resist composition.

TABLE 4

|  | Component (A) | Component (B) | | Component (D) | Component (E) | Component (S) | |
| --- | --- | --- | --- | --- | --- | --- | --- |
| Ex. 5 | (A)-5 [100] | (B)-2 [7.5] | (B)-3 [2.6] | (D)-2 [0.42] | (E)-1 [1.80] | (S)-2 [10] | (S)-3 [2900] |

In Table 4, the values in brackets [ ] indicate the amount (in terms of parts by weight) of the component added, and the reference characters indicate the following.

(A)-5: the aforementioned polymeric compound 5
(B)-2: a compound represented by structural formula (B)-2 shown below
(B)-3: a compound represented by structural formula (B)-3 shown below
(D)-2: tri-n-pentylamine.
(E)-1: salicylic acid
(S)-2: γ-butyrolactone (GBL)
(S)-3: a mixed solvent of PGMEA/PGME/cyclohexanone=45/30/25 (weight ratio)

[Chemical Formula 65]

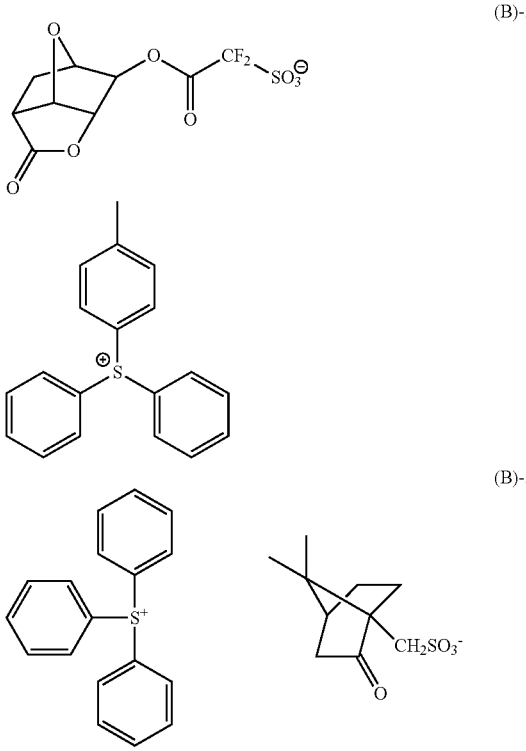

Test Example 2

[Formation of Resist Pattern (Negative Tone Development or Positive Tone Development)]

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 77 nm. The resist composition of Example 5 was then applied to the organic anti-reflection film using a spinner, and was then prebaked (PAB) and dried on a hotplate at 120° C. for 60 seconds, thus forming a resist film having a film thickness of 100 nm. Subsequently, the resist film was selectively irradiated with an ArF excimer laser (193 nm) through a mask pattern targeting an LS pattern having a line width of 130 nm and a pitch of 260 nm, using an ArF exposure apparatus NSR-S302 (manufactured by Nikon Corporation, NA (numerical aperture)=0.60, ⅔ annular illumination). Thereafter, PEB was conducted at 95° C. for 60 seconds, followed by development for 30 seconds using one of the developing solutions 1 to 3 shown below. Then, drying by shaking was conducted without rinsing in the case of negative tone development using the developing solution 1 or 2. In the case of positive tone development using the developing solution 3, rinsing was conducted with pure water, followed by drying by shaking.

Developing solution 1: butyl acetate (BA)/PGME=80/20 (weight ratio)

Developing solution 2: BA/PGME/PGMEA=78/20/2 (weight ratio)

Developing solution 3: 2.38% by weight aqueous TMAH solution "NMD-3" (trade name, manufactured by Tokyo Ohka Kogyo Co., Ltd.)

As a result, with each developing solution, an LS pattern having a line width of 130 nm and a pitch of 260 nm was formed.

Further, the optimum exposure dose Eop (mJ/cm$^2$) with which the LS pattern was formed was determined. The results are shown in Table 5.

[Evaluation of EL Margin]

The exposure dose with which an LS pattern having a dimension of the target dimension (line width: 130 nm)±5% (i.e., 123.5 nm to 136.5 nm) was determined, and the EL margin (unit: %) was determined by the following formula. The results are shown in Table 5.

EL margin (%)=(|E1−E2|/Eop)×100

In the formula, represents the exposure dose (mJ/cm$^2$) for forming an LS pattern having a line width of 123.5 nm, and E2 represents the exposure dose (mJ/cm$^2$) for forming an LS pattern having a line width of 136.5 nm.

TABLE 5

| | Developing solution 1 (Example) | Developing solution 2 (Example) | Developing solution 2 (Comparative Example) |
|---|---|---|---|
| Eop (mJ/cm$^2$) | 28.6 | 28.3 | 35.8 |
| EL margin (%) | 8.9 | 9.6 | 7.8 |

As seen from the results above, even when the same resist composition is used, pattern formation using a negative tone developing solution could be performed with a high resolution and excellent EL margin value, as compared to pattern formation using a positive tone developing solution. Further, by adding a small amount of PGMEA to the developing solution 1, it was confirmed that the EL could be improved.

[Evaluation of Contrast Curve Using Other Developing Solutions]

Using a spinner, the resist composition of Example 5 was applied to an 8-inch silicon wafer that had been treated with hexamethyl disilazane (HMDS), and was then prebaked (PAB) and dried on a hotplate at 120° C. for 60 seconds, thus forming a resist film having a film thickness of 100 nm.

Using an ArF exposure apparatus NSR-S302 (a product name, manufactured by Nikon Corporation, NA (numerical aperture)=0.60, ⅔ annular illumination), the resist film was then irradiated with an ArF excimer laser (193 nm) using an exposure dose of 0 to 20 mJ/cm$^2$. Thereafter, post exposure bake (PEB) was conducted at 95° C. for 60 seconds, followed by development for 15 seconds using one of the developing solutions 4 to 9 shown below. Then, drying was conducted by shaking, followed by post bake treatment at 100° C. for 60 seconds.

Developing solution 4: BA/GBL/PGME=96/3/1 (weight ratio)

Developing solution 5: BA/GBL/PGME=94/5/1 (weight ratio)

Developing solution 6: BA/GBL/PGME=92/3/5 (weight ratio)

Developing solution 7: BA/PGME=90/10 (weight ratio)

Developing solution 8: BA/GBL=95/5 (weight ratio)

Developing solution 9: BA/GBL=93/7 (weight ratio)

The film thickness (residual film, unit: Å) after development with each developing solution and baking was measured using Nanospec 6100A (manufactured by Nanometrics Incorporated). From the change in the residual film depending on the change in the exposure dose, a residual film curve was determined. As a result, as seen from FIG. 1, in each of the examples using one of the developing solutions 4 to 9, a residual film curve with an excellent contrast could be obtained.

From these results, it was confirmed that various negative tone developing solution can be applied to the resist composition of the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, including: forming a resist film on a substrate using a resist composition containing a base component (A) which exhibits decreased solubility in an organic solvent under action of an acid and an acid-generator component (B) which generates an acid upon exposure, conducting exposure of the resist film, and patterning the resist film by a negative tone development using a developing solution comprising an organic solvent,
wherein the base component (A) comprises a resin component (A1) comprised of a structural unit (a1) derived from an acrylate ester containing an acid decomposable group which exhibits increased hydrophilicity by the action of an acid and a structural unit (a0) derived from an acrylate ester containing an $—SO_2—$ containing cyclic group in which the sulfur atom (S) within $—SO_2—$ forms part of a ring skeleton of the cyclic group.

2. The method of forming a resist pattern according to claim 1, wherein the amount of the structural unit (a0) within the resin component (A1), based on the combined total of all the structural units that constitute the resin component (A1) is 10 to 50 mol%.

3. The method of forming a resist pattern according to claim 1, wherein the resin component (A1) further comprises a structural unit (a1) derived from an acrylate ester containing a polar group-containing aliphatic hydrocarbon group.

* * * * *

UNITED STATES PATENT AND TRADEMARK OFFICE
CERTIFICATE OF CORRECTION

PATENT NO. : 8,394,578 B2
APPLICATION NO. : 13/028594
DATED : March 12, 2013
INVENTOR(S) : Tomoyuki Hirano et al.

It is certified that error appears in the above-identified patent and that said Letters Patent is hereby corrected as shown below:

In the Specification

In Column 2, Line 13, please delete "mainstram" and insert --mainstream-- therefor.

In Column 7, Line 64, please delete "at it" and insert --as it-- therefor.

In Column 9, Line 66, please delete "perfluoronpetane;" and insert --perfluoropentane;-- therefor.

In Column 12, Line 49, please delete "acyrlate" and insert --acrylate-- therefor.

In Column 12, Line 51, please delete "acyrlate" and insert --acrylate-- therefor.

In Column 12, Line 52, please delete "acyrlate" and insert --acrylate-- therefor.

In Column 12, Line 54, please delete "acyrlate" and insert --acrylate-- therefor.

In Column 12, Line 56, please delete "acyrlate" and insert --acrylate-- therefor.

In Column 12, Line 57, please delete "acyrlate" and insert --acrylate-- therefor.

In Column 12, Line 57, please delete "methacrylate)" and insert --methacrylate).-- therefor.

In Column 14, Line 67, please delete "acid" and insert --acid.-- therefor.

In Column 17, Line 6, please delete "adamantine" and insert --adamantane-- therefor.

In Column 24, Line 38, please delete "allylene" and insert --alkylene-- therefor.

In Column 54, Line 66, please delete "monocycloallcane." and insert --monocycloalkane.-- therefor.

In Column 59, Line 63, please delete "adamantine" and insert --adamantane-- therefor.

In Column 61, Line 64, please delete "from," and insert --from-- therefor.

In Column 70, Line 27, please delete "propionolatone," and insert --propiolactone,-- therefor.

In Column 71, Line 58, please delete "group" and insert --group.-- therefor.

In Column 86, Line 65, please delete "thereof;" and insert --thereof,-- therefor.

In Column 98, Line 52 (approx.), please delete "hydroxyallyl" and insert --hydroxyalkyl-- therefor.

In Column 100, Line 21, please delete "(=O)—," and insert --(=O)—, —C(=O)—O—,-- therefor.

Signed and Sealed this
Twenty-second Day of October, 2013

Teresa Stanek Rea
*Deputy Director of the United States Patent and Trademark Office*

CERTIFICATE OF CORRECTION (continued)
U.S. Pat. No. 8,394,578 B2

In Column 102, Line 13, please delete "adamantine" and insert --adamantane-- therefor.

In Column 102, Line 35, please delete "hydroxyallyl" and insert --hydroxyalkyl-- therefor.

In Column 103, Line 1, please delete "butyryl" and insert --butynyl-- therefor.

In Column 128, Line 46, please delete "400" and insert --400 nm-- therefor.